US012569945B2

(12) United States Patent
Moon et al.

(10) Patent No.: US 12,569,945 B2
(45) Date of Patent: Mar. 10, 2026

(54) APPARATUS FOR MANUFACTURING DISPLAY PROCESSING MASK AND METHOD OF MANUFACTURING DISPLAY PROCESSING MASK USING THE SAME

(71) Applicant: Samsung Display Co., Ltd., Yongin-si (KR)

(72) Inventors: Youngmin Moon, Yongin-si (KR); Youngho Park, Suwon-si (KR); Junho Jo, Seoul (KR); Seungyong Song, Suwon-si (KR); Sungsoon Im, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 973 days.

(21) Appl. No.: 17/729,463

(22) Filed: Apr. 26, 2022

(65) Prior Publication Data

US 2023/0068722 A1      Mar. 2, 2023

(30) Foreign Application Priority Data

Aug. 27, 2021      (KR) ........................ 10-2021-0113609

(51) Int. Cl.
| | |
|---|---|
| *B23K 37/04* | (2006.01) |
| *B23K 26/21* | (2014.01) |
| *B23K 26/38* | (2014.01) |
| *C23C 14/04* | (2006.01) |
| *C23C 14/24* | (2006.01) |
| *H10K 71/00* | (2023.01) |

(52) U.S. Cl.
CPC .......... *B23K 37/0443* (2013.01); *B23K 26/21* (2015.10); *B23K 26/38* (2013.01); *C23C 14/042* (2013.01); *C23C 14/24* (2013.01); *H10K 71/00* (2023.02)

(58) Field of Classification Search
CPC ............ B23K 37/0443; B23K 37/0235; B23K 37/0461; B23K 37/0408; C23C 14/24; C23C 14/042
See application file for complete search history.

(56) References Cited

U.S. PATENT DOCUMENTS 11,316,111 B2      4/2022   Kim

FOREIGN PATENT DOCUMENTS

| CN | 204221303 | U | * | 3/2015 | |
|---|---|---|---|---|---|
| JP | 6844646 | B2 | | 3/2021 | |
| KR | 20150034949 | A | * | 9/2013 | |
| KR | 10-2019-0096896 | A | | 8/2019 | |
| KR | 20200009799 | A | * | 1/2020 | ............ H01L 51/56 |
| KR | 10-2020-0070465 | A | | 6/2020 | |
| KR | 10-2020-0096361 | A | | 8/2020 | |

(Continued)

*Primary Examiner* — Thien S Tran
(74) *Attorney, Agent, or Firm* — Womble Bond Dickinson (US) LLP

(57) ABSTRACT

A display processing mask manufacturing apparatus includes a stage, a clamp arranged outside the stage, and a chuck configured to move in a direction and arranged above the stage. The clamp includes a first clamp and a second clamp spaced apart from the first clamp in a first direction and arranged at a position opposite to a position of the first clamp with respect to the stage, and the chuck includes a first chuck and a second chuck spaced apart from the first chuck in a second direction crossing the first direction.

20 Claims, 25 Drawing Sheets

(56)     References Cited

FOREIGN PATENT DOCUMENTS

| KR | 10-2193044 B1 | 12/2020 |
| KR | 10-2217810 B1 | 2/2021 |
| KR | 10-2241770 B1 | 4/2021 |

* cited by examiner

I–I'

II–II'

APPARATUS FOR MANUFACTURING DISPLAY PROCESSING MASK AND METHOD OF MANUFACTURING DISPLAY PROCESSING MASK USING THE SAME

CROSS-REFERENCE TO RELATED APPLICATION

This application claims priority to and the benefit of Korean Patent Application No. 10-2021-0113609, filed on Aug. 27, 2021 in the Korean Intellectual Property Office, the entire content of which is hereby incorporated by reference.

BACKGROUND

1. Field

Aspects of embodiments of the present disclosure relate to an apparatus for manufacturing a display processing mask and a method of manufacturing a display processing mask using the apparatus.

2. Description of the Related Art

A display is manufactured through a variety of processes. As an example, a deposition process is performed in a manufacturing process of a display. In the deposition process performed to manufacture the display, a fine metal mask (FMM) may be attached closely to a substrate to deposit organic materials. The fine metal mask is coupled to a frame prior to attaching the fine metal mask closely to a substrate. The fine metal mask is fixed to the frame by welding a wing coupled to an outer portion of the fine metal mask to the frame. Before fixing the fine metal mask and the wing to the frame, it is necessary to first align the mask with the frame.

SUMMARY

According to an aspect of embodiments of the present disclosure, an apparatus for manufacturing a display processing mask, which is capable of uniformly tensioning a mask, is provided.

According to another aspect of embodiments of the present disclosure, a method of manufacturing a display processing mask is provided.

According to one or more embodiments of the present disclosure, an apparatus for manufacturing a display processing mask includes a stage, a clamp arranged outside the stage, and a chuck configured to move in a direction and arranged above the stage. The clamp includes a first clamp and a second clamp spaced apart from the first clamp in a first direction and arranged at a position opposite to a position of the first clamp with respect to the stage. The chuck includes a first chuck and a second chuck spaced apart from the first chuck in a second direction crossing the first direction.

According to one or more embodiments of the present disclosure, an apparatus for manufacturing a display processing mask includes a support body, a pair of clamps arranged above the support body, and a pair of chucks arranged above the support body. The clamps are spaced apart from each other in a horizontal direction, and the chucks are spaced apart from each other in a horizontal direction perpendicular (perpendicular or substantially perpendicular) to the horizontal direction in which the clamps are spaced apart from each other.

According to one or more embodiments of the present disclosure, a method of manufacturing a display processing mask includes arranging a frame on a support body, arranging a fixing stick on the frame, arranging a process mask on the fixing stick, tensioning the process mask, and welding the tensioned process mask. The tensioning of the process mask includes tensioning the process mask in a first direction using a clamp and tensioning the process mask in a second direction crossing the first direction using a chuck.

According to an aspect of one or more embodiments, the mask is fixed to the frame while the mask is uniformly tensioned.

According to another aspect of one or more embodiments, the display processing mask for a large-sized display is manufactured.

According to another aspect of one or more embodiments, a yield of the display processing mask is improved.

According to another aspect of one or more embodiments, a quality of the display processing mask is secured above a certain level.

BRIEF DESCRIPTION OF THE DRAWINGS

The above and other aspects and advantages of the present disclosure will become readily apparent by reference to the following detailed description when considered in conjunction with the accompanying drawings wherein.

DETAILED DESCRIPTION

Figure 1:
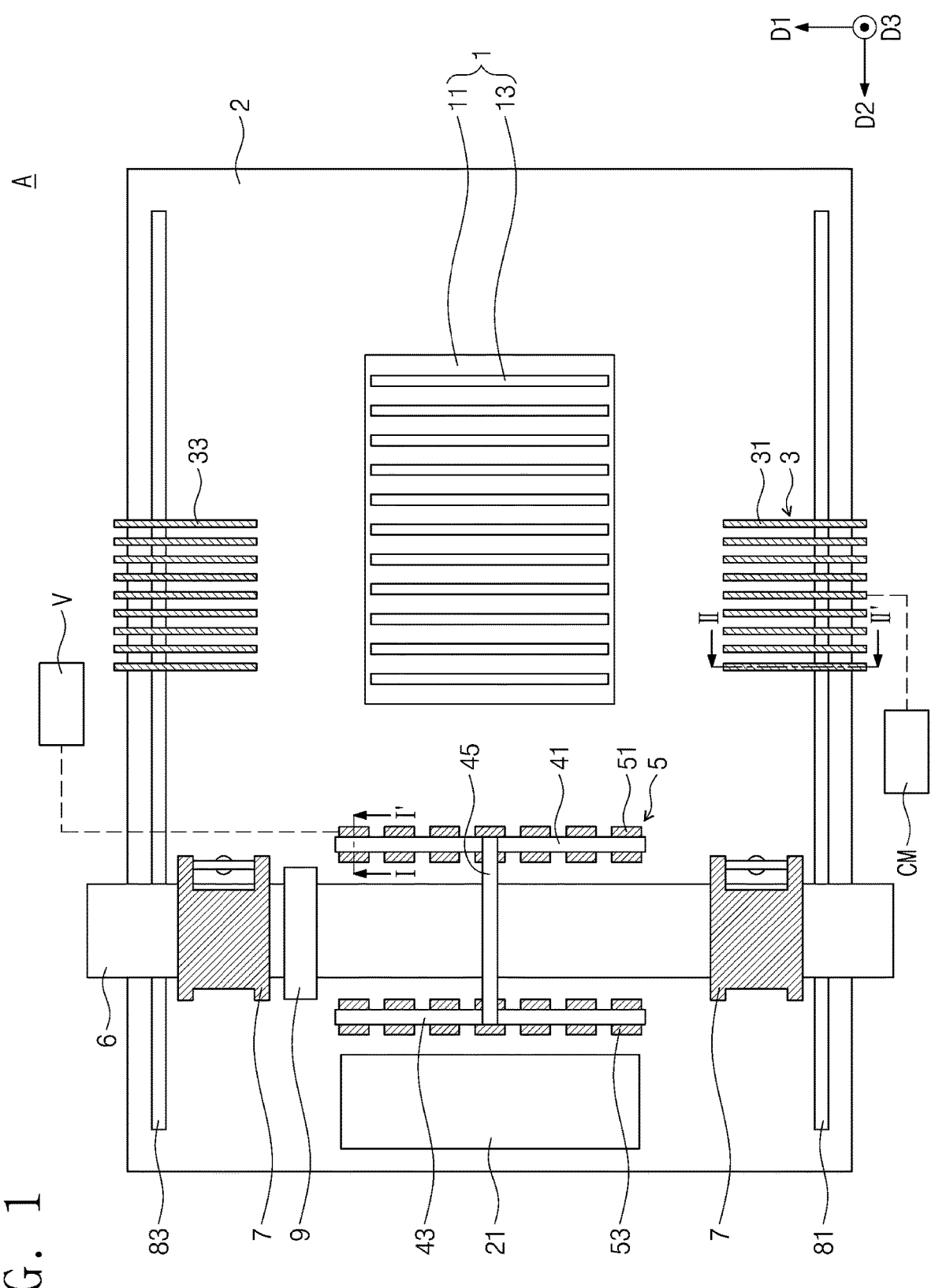
FIG. 1 is a plan view showing an apparatus for manufacturing a display processing mask according to an embodiment of the present disclosure.

The present invention will be described more fully herein with reference to the accompanying drawings, in which some embodiments are shown. The present invention may, however, be embodied in many different forms, and should not be construed as limited to the embodiments set forth herein.

In the present disclosure, it is to be understood that when an element (or area, layer, or portion) is referred to as being "on," "connected to," or "coupled to" another element or layer, it may be directly on, connected, or coupled to the other element or layer or one or more intervening elements or layers may be present.

Like numerals refer to like elements throughout. In the drawings, the thickness, ratio, and dimension of components may be exaggerated for effective description of the technical content. As used herein, the term "and/or" may include any and all combinations of one or more of the associated listed items.

It is to be understood that, although the terms "first," "second," etc. may be used herein to describe various elements, these elements are not to be limited by these terms. These terms are used to distinguish one element from another element. Thus, a first element discussed below could be termed a second element without departing from the teachings of the present disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element or feature's relationship to another element(s) or feature(s) as illustrated in the figures.

It is to be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It is to be further understood that terms, such as those defined in commonly used dictionaries, should be interpreted as having a meaning that is consistent with their meaning in the context of the relevant art and are not to be interpreted in an idealized or overly formal sense unless expressly so defined herein.

Herein, the present disclosure will be explained in further detail with reference to the accompanying drawings.

FIG. 1 is a plan view showing an apparatus A for manufacturing a mask used in a manufacturing process for a display device (herein, referred to as a display processing mask manufacturing apparatus A) according to an embodiment of the present disclosure.

Herein, D1 may refer to a first direction, D2 may refer to a second direction crossing the first direction D1, and D3 may refer to a third direction crossing each of the first direction D1 and the second direction D2. The third direction D3 may be referred to as an upward direction, and a direction opposite to the third direction D3 may be referred to as a downward direction. In addition, each of the first direction D1 and the second direction D2 may be referred to as a horizontal direction.

Referring to FIG. 1, the display processing mask manufacturing apparatus A may be provided. The display processing mask manufacturing apparatus A may be an apparatus used to manufacture a mask (herein, referred to as a display processing mask) used in a deposition process during a display manufacturing process. In further detail, the display processing mask manufacturing apparatus A may manufacture the display processing mask to be attached closely to a substrate for the deposition process. The display processing mask may be a fine metal mask (FMM); however, it is not limited thereto or thereby. According to an embodiment, the display processing mask manufacturing apparatus A may be used to manufacture masks for other uses.

In an embodiment, the display processing mask manufacturing apparatus A may include a support body 2, a stage 1, a clamping unit (or clamp) 3, a chucking unit (or chuck) 5, a gantry 6, a laser unit 7, movement guides 81 and 83, a measuring unit 9, a vacuum pump V, and a clamp driving unit CM.

The support body 2 may support the stage 1 and the clamping unit 3. The support body 2 may have a rectangular shape, but is not limited to the rectangular shape. A process of combining a process mask DM (refer to FIG. 9) to a frame F (refer to FIG. 9) may be performed above the support body 2. A mask loading unit (or mask loader) 21 may be provided on the support body 2. The process mask DM may be loaded on the mask loading unit 21.

The stage 1 may be placed on the support body 2. The stage 1 may support the process mask welded to the frame. The stage 1 may include a stage body 11 and a fixing unit 13.

In an embodiment, the stage body 11 may have a quadrangular shape when viewed in a plane. The stage body 11 may be formed of aluminum (Al) and/or quartz, but is not limited thereto or thereby. The fixing unit 13 may be placed above the stage body 11.

The fixing unit 13 may fix a fixing stick FS (refer to FIG. 6) disposed on the stage 1 to a certain position. In an embodiment, the fixing unit 13 may include a magnet, a vacuum hole, and/or an electrostatic chuck (ESC). In a case in which the fixing unit 13 is the magnet, the fixing unit 13 may be magnetically coupled with the fixing stick FS to fix the fixing stick FS thereto. In a case in which the fixing unit 13 is the vacuum hole, the fixing unit 13 may fix the fixing stick FS placed on the vacuum hole thereto with a vacuum pressure. In a case in which the fixing unit 13 is the electrostatic chuck, the fixing unit 13 may fix the fixing stick FS thereto using an electrostatic force. The fixing unit 13 may extend in the first direction D1 by a length (e.g., a predetermined length). In an embodiment, the fixing unit 13 may be provided in plural. The fixing units 13 may be disposed spaced apart from each other in the second direction D2. As the fixing unit 13 is provided in plural, the fixing units 13 may fix a plurality of fixing sticks FS. In an embodiment, the fixing units 13 may be driven independently from each other. In an embodiment, in a case in which the fixing stick FS is disposed on only some fixing units 13, only the fixing units 13 on which the fixing stick FS is disposed may be selectively driven. However, herein, for convenience of explanation, the fixing unit 13 will be described in a singular form unless otherwise specified. Further detailed description of the stage 1 will be provided later.

The clamping unit 3 may be disposed outside the stage 1. The clamping unit 3 may move the process mask DM (refer to FIG. 9). In further detail, the clamping unit 3 may move the process mask DM such that the process mask DM may be disposed on the stage 1. In addition, the clamping unit 3 may tension the process mask DM. As an example, the clamping unit 3 may tension the process mask DM in the first direction D1.

The clamping unit 3 may include a first clamp 31 and a second clamp 33. The first clamp 31 may pull the process mask DM in a direction opposite to the first direction D1. The second clamp 33 may pull the process mask DM in the first direction D1. Each of the first clamp 31 and the second clamp 33 may move. As an example, each of the first clamp 31 and the second clamp 33 may move in the first direction D1 and the second direction D2. The movement of each of the first clamp 31 and the second clamp 33 in the second direction D2 may be provided along the movement guides 81 and 83. Each of the first clamp 31 and the second clamp 33 may move in the first direction D1 and the direction opposite to the first direction D1 to pick up the process mask DM.

The first clamp 31 and the second clamp 33 may be spaced apart from each other in the first direction D1. The first clamp 31 and the second clamp 33 may be located on opposite sides with respect to the stage 1. In an embodiment, the first clamp 31 may be provided in plural. The first clamps 31 may be spaced apart from each other in the second direction D2. In addition, the second clamp 33 may be provided in plural. The second clamps 33 may be spaced apart from each other in the second direction D2. However, herein, for convenience of explanation, each of the first clamp 31 and the second clamp 33 will be described in a singular form unless otherwise specified. Further detailed descriptions of the first clamp 31 and the second clamp 33 will be provided later with reference to FIG. 3.

The chucking unit 5 may be disposed above the support body 2. The chucking unit 5 may move in a direction and may be disposed above the stage 1. In further detail, the chucking unit 5 may move in the second direction D2 above the support body 2. As an example, the chucking unit 5 may be coupled with the gantry 6 and may move in the second direction D2 together with the gantry 6. The chucking unit 5 may tension the process mask DM in the second direction D2. In an embodiment, the chucking unit 5 may include a first chuck 51 and a second chuck 53. In an embodiment, each of the first chuck 51 and the second chuck 53 may adsorb the process mask DM. In further detail, each of the first chuck 51 and the second chuck 53 may adsorb an upper surface of the process mask DM using vacuum pressure. The first chuck 51 and the second chuck 53 may be spaced apart from each other in the second direction D2. Accordingly, the first chuck 51 and the second chuck 53 may adsorb opposite portions of the process mask DM, respectively.

In an embodiment, each of the first chuck 51 and the second chuck 53 may pull the process mask DM adsorbed thereto in the second direction D2 to tension the process mask DM. In further detail, the first chuck 51 may move in a direction opposite to the second direction D2 while adsorbing the process mask DM, the second chuck 53 may move in the second direction D2 while adsorbing the process mask DM, and, thus, the process mask DM may be tensioned in the second direction D2. In an embodiment, each of the first chuck 51 and the second chuck 53 may be connected to the vacuum pump V. In an embodiment, a separation distance in the second direction D2 between the first chuck 51 and the second chuck 53 may be changed.

In an embodiment, the first chuck 51 may be provided in plural. The first chucks 51 may be spaced apart from each other in the first direction D1. The first chucks 51 may be connected to each other by a first connection unit 41. In addition, the second chuck 53 may be provided in plural. The second chucks 53 may be spaced apart from each other in the first direction D1. The second chucks 53 may be connected to each other by a second connection unit 43. The first connection unit 41 and the second connection unit 43 may be connected to each other by a third connection unit 45. In an embodiment, the third connection unit 45 may connect the first chucks 51 and the second chucks 53 to the gantry 6. However, herein, for convenience of explanation, each of the first chuck 51 and the second chuck 53 will be described in a singular form unless otherwise specified. Further detailed descriptions of the first chuck 51 and the second chuck 53 will be provided later with reference to FIG. 2.

The gantry 6 may support the chucking unit 5, the laser unit 7, and the measuring unit 9. The gantry 6 may move the chucking unit 5, the laser unit 7, and the measuring unit 9 in the second direction D2. In an embodiment, the gantry 6 may move along the movement guides 81 and 83, but is not limited thereto or thereby. According to an embodiment, the gantry 6 may move by a separate driving device or guide.

The laser unit 7 may weld the process mask DM (refer to FIG. 9) onto the frame F (refer to FIG. 9) or may cut a portion of the process mask DM. In an embodiment, the laser unit 7 may include a welding laser unit and a cutting laser unit. In an embodiment, a laser beam irradiated by the welding laser unit and a laser beam irradiated by the cutting laser unit may have different wavelength bands from each other. As an example, the welding laser unit may irradiate the laser beam in a wavelength band of micrometers to nanometers. The cutting laser unit may irradiate the laser beam in a wavelength band of picoseconds to femtoseconds.

The laser unit 7 may be connected to the gantry 6. The laser unit 7 may move in the first direction D1 along the gantry 6. In an embodiment, two laser units 7 may be provided to the gantry 6. One of the two laser units 7 may be the welding laser unit, and the other of the two laser units 7 may be the cutting laser unit; however, embodiments of the present disclosure are not limited thereto or thereby. According to an embodiment, each of the two laser units 7 may include the laser units for the welding and cutting processes.

The movement guides 81 and 83 may extend in the second direction D2 above the support body 2. The movement guides 81 and 83 may include a first guide 81 and a second guide 83. The first guide 81 and the second guide 83 may be spaced apart from each other in the first direction D1. The gantry 6 and/or the clamping unit 3 may move in the second direction D2 along the first guide 81 and the second guide 83.

The measuring unit 9 may be connected to the gantry 6. The measuring unit 9 may identify an aligned state of the process mask DM. The clamping unit 3 and/or the chucking unit 5 may align the process mask DM based on the aligned state measured by the measuring unit 9.

The vacuum pump V may be connected to the first chuck 51 and the second chuck 53. The vacuum pump V may apply the vacuum pressure to the first chuck 51 and the second chuck 53. The first chuck 51 and the second chuck 53 may adsorb the process mask DM using the vacuum pressure provided thereto from the vacuum pump V.

The clamp driving unit CM may operate the clamping unit 3. As an example, the clamp driving unit CM may control the clamping unit 3 to move the first clamp 31 and the second clamp 33 or to pick up the process mask DM. In an embodiment, the clamp driving unit CM may include an actuator, such as a motor.

Figure 2:
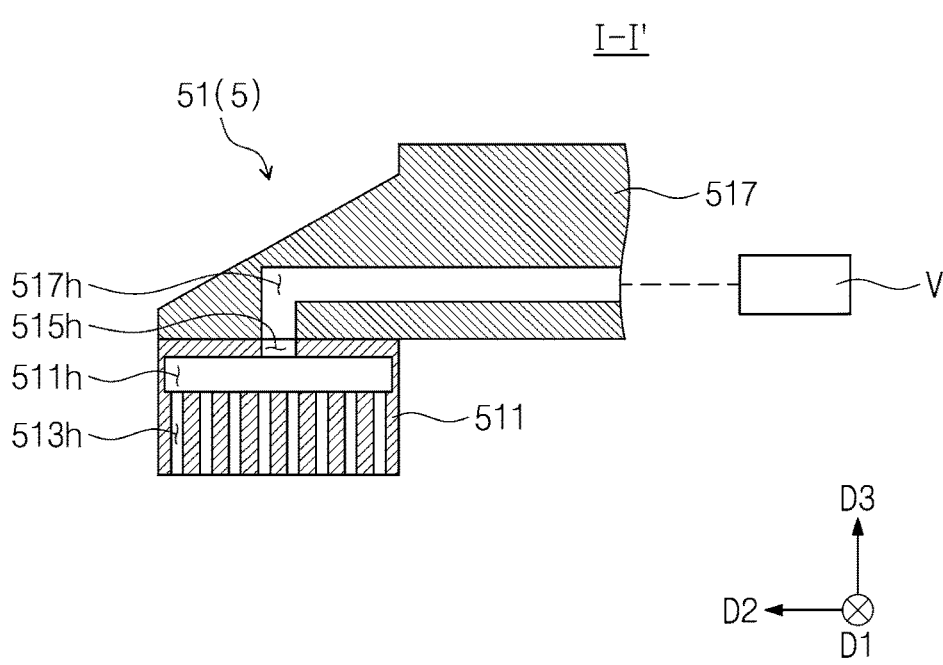
FIG. 2 is a cross-sectional view taken along the line I-I' of FIG. 1 to show a chuck according to an embodiment of the present disclosure.

FIG. 2 is a cross-sectional view taken along the line I-I' of FIG. 1 to show the chuck according to an embodiment of the present disclosure.

Referring to FIG. 2, the first chuck 51 may include an adsorption body 511 and a connection body 517.

The adsorption body 511 may be provided with a vacuum pressure distribution space 511$h$, an adsorption hole 513$h$, and a connection hole 515$h$, which are defined therein. The vacuum pressure distribution space 511$h$ may be defined in the adsorption body 511. The vacuum pressure distribution space 511$h$ may extend in a horizontal direction. The adsorption hole 513$h$ may extend downward from the vacuum pressure distribution space 511$h$ by a length (e.g., a predetermined length). The adsorption hole 513$h$ may be connected to a lower surface of the adsorption body 511.

Accordingly, the adsorption hole 513h may be exposed to the lower space of the adsorption body 511. That is, the vacuum pressure distribution space 511h may be connected to the lower space of the adsorption body 511 via the adsorption hole 513h.

In an embodiment, the adsorption hole 513h may be provided in plural. Each of the adsorption holes 513h may be connected to the vacuum pressure distribution space 511h. The adsorption holes 513h may be defined to be spaced apart from each other in the horizontal direction. Accordingly, the adsorption body 511 may have a porous structure when viewed from below. The connection hole 515h may extend upward from the vacuum pressure distribution space 511h. The connection hole 515h may be connected to an upper surface of the adsorption body 511.

The connection body 517 may be coupled with the adsorption body 511. The adsorption body 511 may be connected to the vacuum pump V via the connection body 517. The connection body 517 may define a vacuum pressure connection path 517h. The vacuum pressure connection path 517h may be connected to the connection hole 515h in a state in which the connection body 517 is coupled with the adsorption body 511. Accordingly, the vacuum pump V may be connected to the vacuum pressure distribution space 511h via the vacuum pressure connection path 517h and the connection hole 515h.

Although not shown in figures, the second chuck 53 (refer to FIG. 1) may also have substantially the same or similar structure as the first chuck 51.

Figure 3:
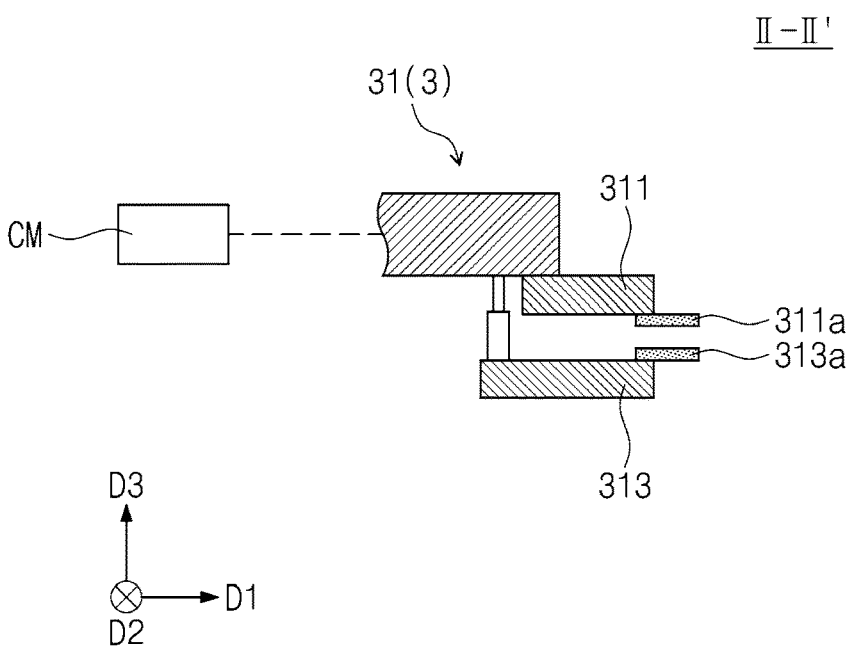
FIG. 3 is a cross-sectional view taken along the line II-II' of FIG. 1 to show a clamp according to an embodiment of the present disclosure.

FIG. 3 is a cross-sectional view taken along the line II-II' of FIG. 1 to show the clamp according to an embodiment of the present disclosure.

Referring to FIG. 3, the first clamp 31 may be connected to the clamp driving unit CM. The first clamp 31 may be operated by the clamp driving unit CM. The first clamp 31 may include a clamp upper portion 311, a clamp lower portion 313, an upper contact portion 311a, and a lower contact portion 313a. The clamp upper portion 311 and the clamp lower portion 313 may be spaced apart from each other in a vertical direction. A relative distance between the clamp upper portion 311 and the clamp lower portion 313 may be changed. As an example, the clamp lower portion 313 may move up and down, and, thus, a distance from the clamp upper portion 311 may be changed.

The upper contact portion 311a may be coupled with the clamp upper portion 311. The lower contact portion 313a may be coupled with the clamp lower portion 313. The process mask DM (refer to FIG. 9) may be inserted between the upper contact portion 311a and the lower contact portion 313a. The upper contact portion 311a and the lower contact portion 313a may press up and down to pick up the process mask DM.

Although not shown in figures, the second clamp 33 (refer to FIG. 1) may also have substantially the same or similar structure as the first clamp 31.

Figure 4:
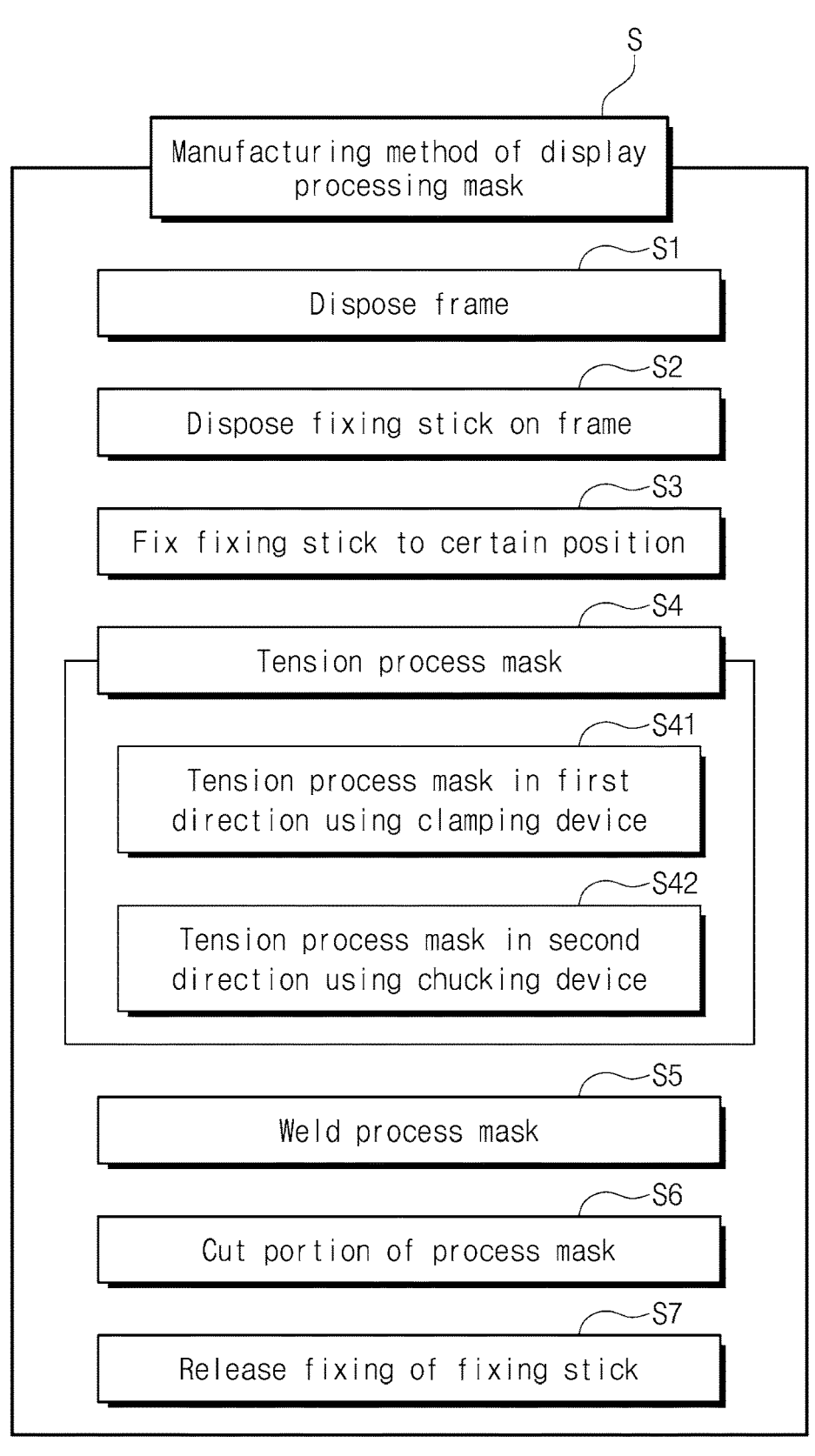
FIG. 4 is a flowchart showing a method of manufacturing a display processing mask according to an embodiment of the present disclosure.

FIG. 4 is a flowchart showing a method of manufacturing a display processing mask according to an embodiment of the present disclosure.

Referring to FIG. 4, a manufacturing method S of a display processing mask may be provided. According to the display processing mask manufacturing method S, a display processing mask DMA (refer to FIG. 24) may be manufactured using the display processing mask manufacturing apparatus A (refer to FIG. 1). In further detail, an integral type display processing mask DMA obtained by combining the process mask DM (refer to FIG. 24) to the frame F (refer to FIG. 24) may be manufactured by the display processing mask manufacturing method S.

In an embodiment, the display processing mask manufacturing method S may include disposing a frame (S1), disposing a fixing stick on the frame (S2), fixing the fixing stick to a certain position (S3), tensioning a process mask (S4), welding the process mask (S5), cutting a portion of the process mask (S6), and releasing the fixing of the fixing stick (S7).

In an embodiment, the tensioning the process mask (S4) may include tensioning the process mask in a first direction using a clamping unit (S41) and tensioning the process mask in a second direction using a chucking unit (S42).

Herein, processes of the display processing mask manufacturing method S of FIG. 4 will be sequentially described with reference to FIGS. 5 to 23.

FIGS. 5 to 23 are plan views and cross-sectional views sequentially showing the manufacturing method of the display processing mask according to the flowchart of FIG. 4.

Figure 5:
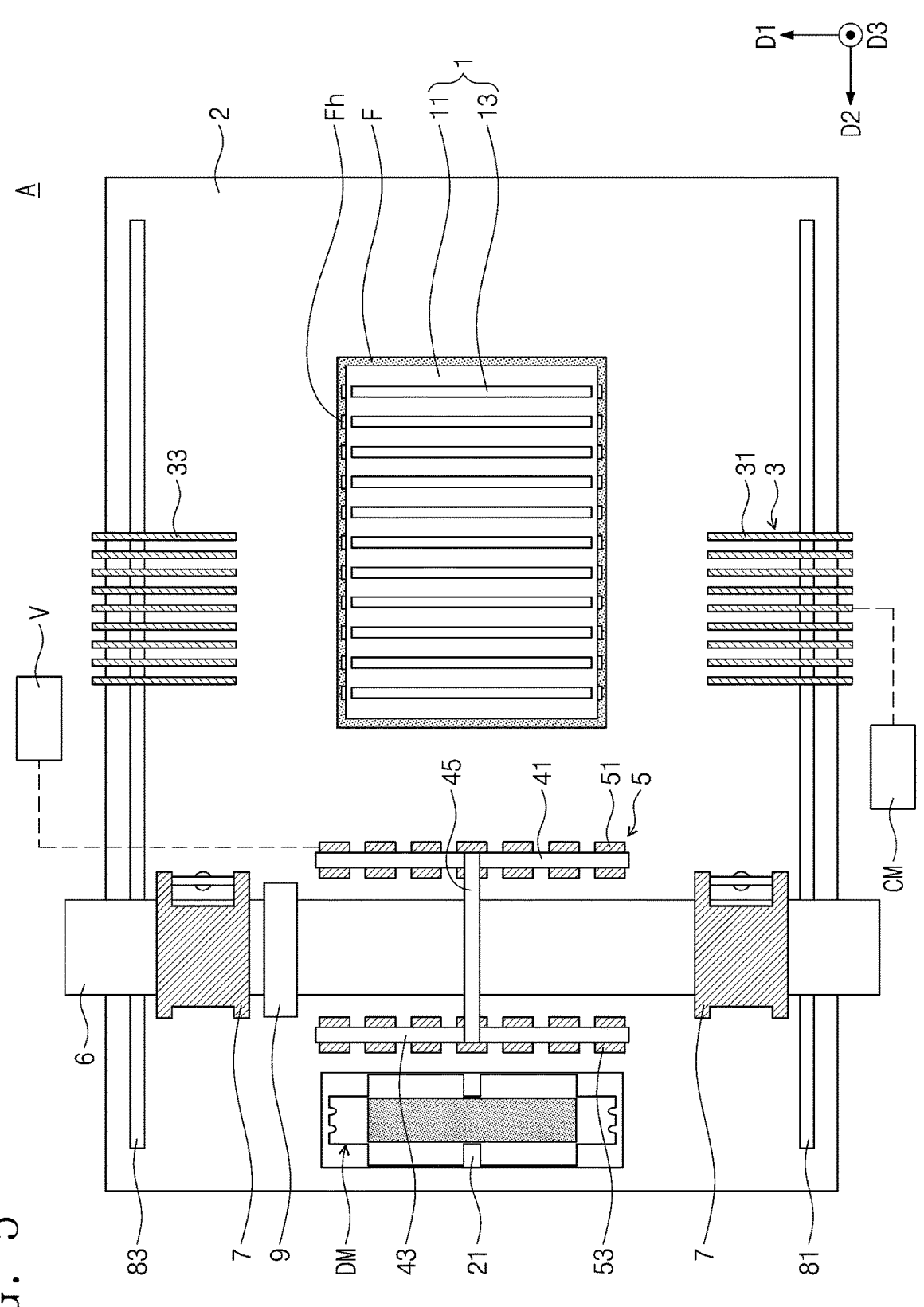
FIGS. 5 to 23 are plan views and cross-sectional views sequentially showing a method of manufacturing a display processing mask.

Referring to FIGS. 4 and 5, the disposing of the frame (S1) may include disposing the frame F on the support body 2. In an embodiment, the frame F may be disposed on the support body 2 to surround the stage 1. Accordingly, the frame F may surround the stage 1. The frame F may be a member that supports the process mask DM of the display processing mask DMA (refer to FIG. 24). The frame F may be formed of a solid material. As an example, the frame F may include SUS and/or Invar. The frame F may have a frame shape with a hole defined therethrough.

The frame F may define a stick placement hole Fh. The stick placement hole Fh may be a space recessed downward from an upper surface of the frame F by a depth (e.g., a predetermined depth). The fixing stick FS (refer to FIG. 6) may be disposed on the certain position of the frame F via the stick placement hole Fh. In an embodiment, the stick placement hole Fh may be provided in plural. The stick placement holes Fh may be spaced apart from each other in the second direction D2. Accordingly, the plural fixing sticks FS may be disposed on one frame F. However, for the convenience of explanation, the stick placement hole Fh will be described in a singular form unless otherwise specified.

Figure 6:
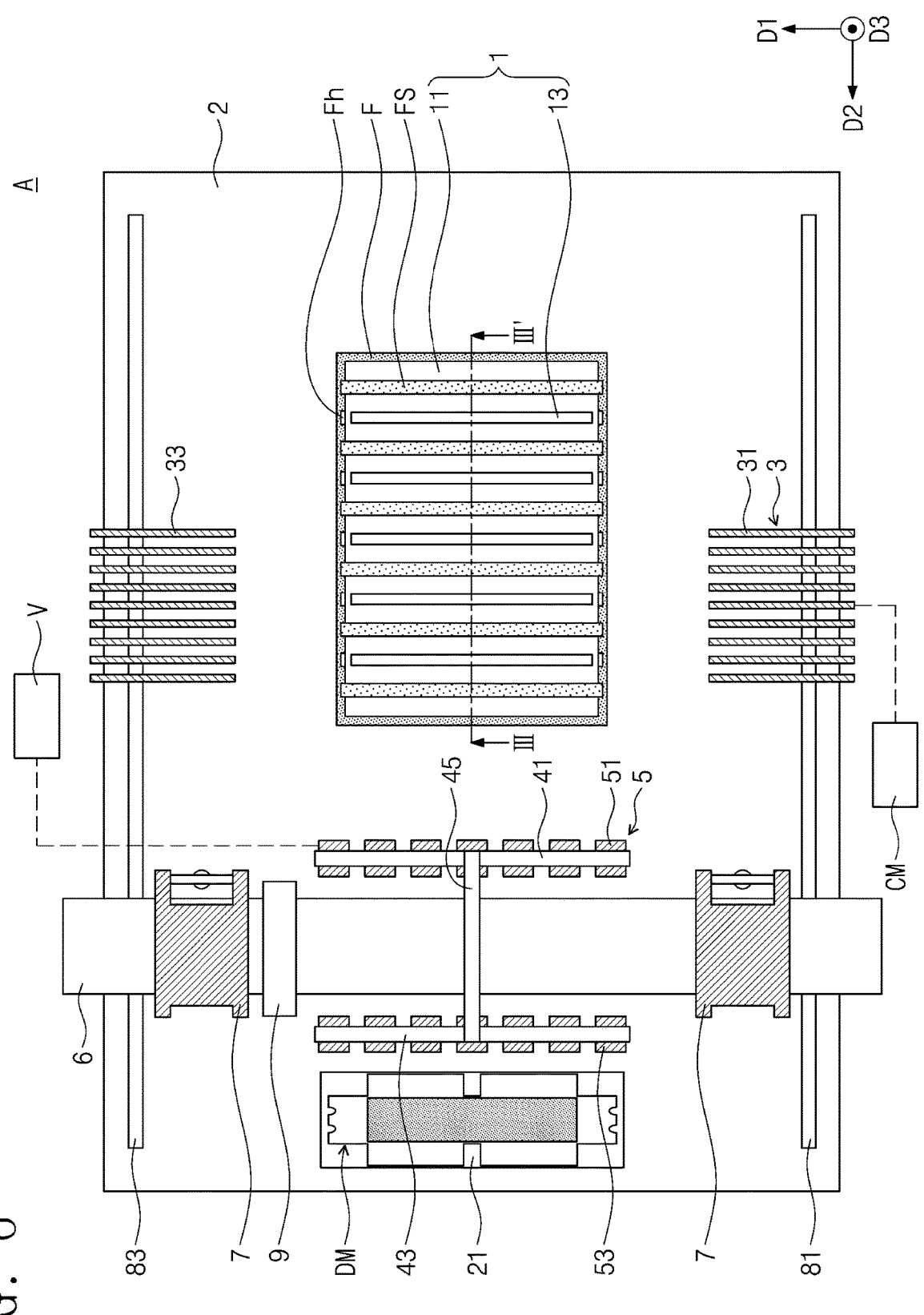

Referring to FIGS. 4 and 6, the disposing of the fixing stick on the frame (S2) may include disposing the fixing stick FS on the stick placement hole Fh of the frame F. In an embodiment, since the stick placement hole Fh is provided in plural, the plural fixing sticks FS may be disposed on the frame F. According to an embodiment, the fixing stick FS may not be inserted into some stick placement holes Fh. As an example, the fixing stick FS may be disposed in only some stick placement holes Fh by skipping one of every two stick placement holes Fh, as shown in FIG. 6.

The fixing stick FS may extend in the first direction D1. In an embodiment, the fixing stick FS may include SUS and/or Invar, but is not limited thereto or thereby. The fixing stick FS may have a small thickness. As an example, the fixing stick FS may have a thickness from about 100 μm to about 250 μm. In an embodiment, a level of an upper surface of the fixing stick FS disposed on the frame F and a level of the upper surface of the frame F may be substantially the same or similar as each other.

Figure 7:
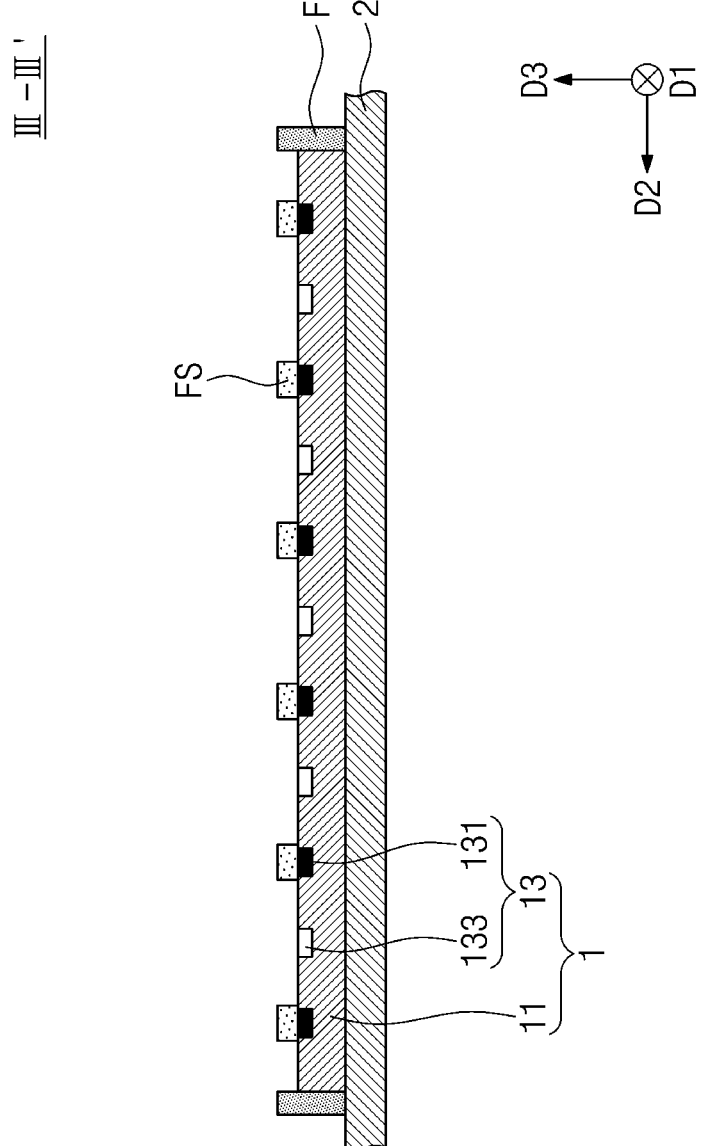

Referring to FIGS. 4 and 7, the fixing of the fixing stick to the certain position (S3) may include firmly fixing the fixing stick FS to the certain position using the fixing unit 13. As an example, in a case in which the fixing unit 13 includes the magnet, the fixing stick FS disposed on one fixing unit 13 may be stably fixed to a corresponding fixing unit 131 by a magnetic force of the fixing unit 131. In a case in which the fixing unit 13 is provided with the vacuum hole defined therein, the fixing stick FS may be stably fixed to the corresponding fixing unit 131 by the vacuum pressure provided thereto from the vacuum hole. In this case, the vacuum pressure may not be provided to a fixing unit 133 on which the fixing stick FS is not disposed. In a case in which the fixing unit 13 includes the electrostatic chuck, the fixing stick FS may be stably fixed to the corresponding fixing unit 131 by the electrostatic force. In this case, the electrostatic force may not be provided to the fixing unit 133 on which the fixing stick FS is not disposed. In this way, the fixing sticks FS may be firmly fixed to the corresponding positions after being placed on the frame F.

Figure 8:
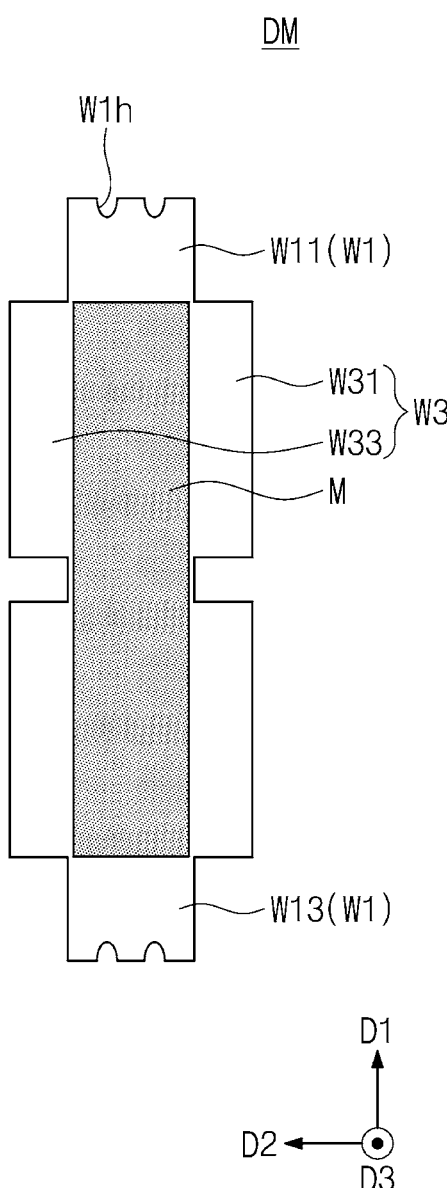
Figure 9:
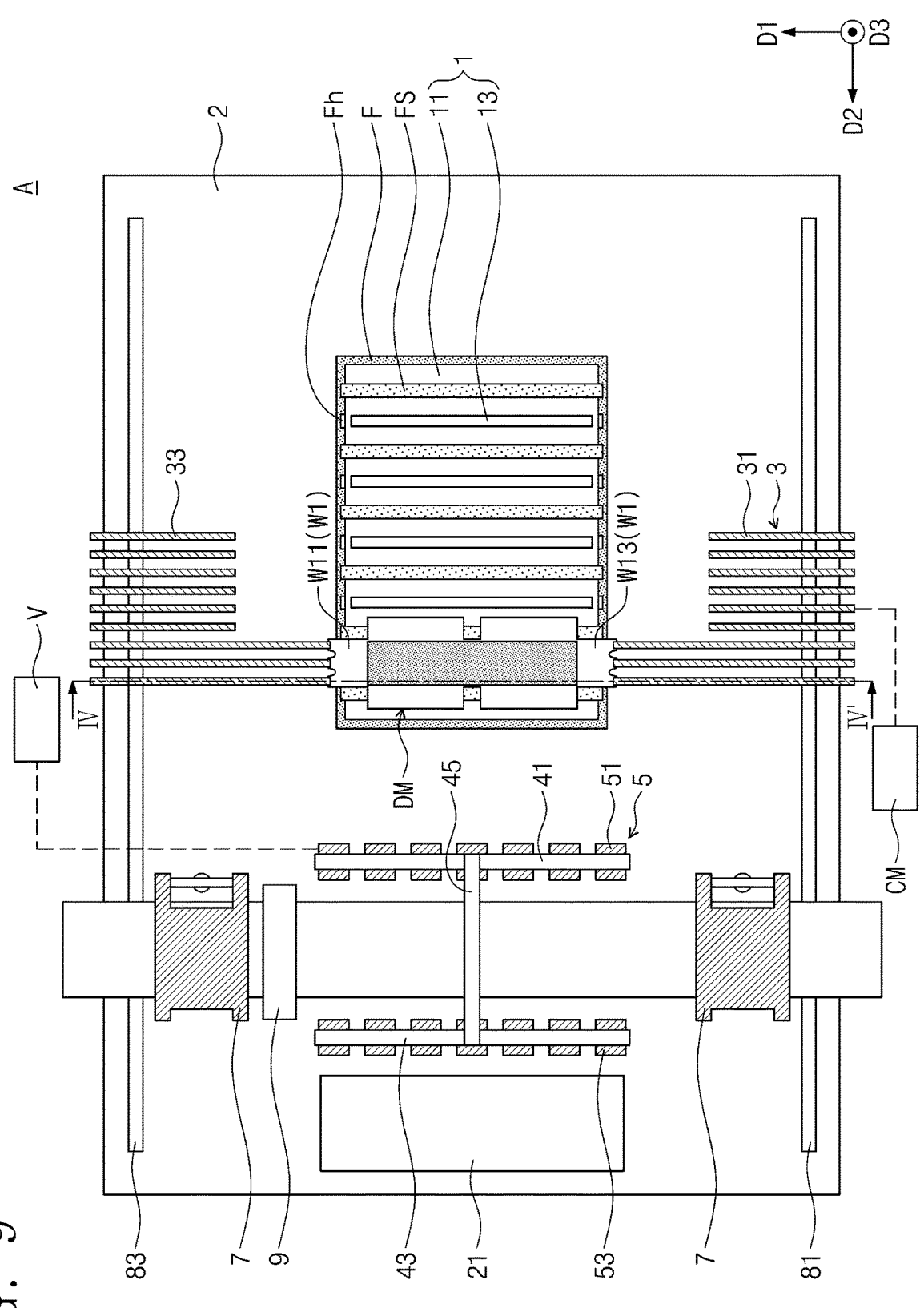

Referring to FIGS. 8 and 9, the process mask DM in the mask loading unit 21 may move onto the frame F. The process mask DM may be disposed on the frame F and the fixing stick FS. In further detail, the process mask DM may be placed at a position that is lifted up at a certain distance from the upper surface of each of the frame F and the fixing stick FS by the first clamp 31 and the second clamp 33.

The process mask DM may include a first stick W1, a second stick W3, and a mask M. The first stick W1 may include a first wing W11 and a second wing W13. The first wing W11 may be disposed at a position in the first direction D1 with respect to the mask M. The second wing W13 may be disposed at a position in the direction opposite to the first direction D1 with respect to the mask M. The first wing W11 may be spaced apart from the second wing W13 in the first direction D1. The first wing W11 may be disposed at an opposite side to the second wing W13 with respect to the mask M. The second stick W3 may include a third wing W31 and a fourth wing W33, which extend in the first direction D1. The third wing W31 may be disposed at a position in a direction opposite to the second direction D2 with respect to the mask M. The fourth wing W33 may be disposed at a position in the second direction D2 with respect to the mask M. The fourth wing W33 may be spaced apart from the third wing W31 in the second direction D2. The third wing W31 may be disposed at an opposite side to the fourth wing W33 with respect to the mask M. That is, the mask M may be disposed between the first wing W11, the second wing W13, the third wing W31, and the fourth wing W33. In an embodiment, two third wings W31 and two fourth wings W33 may be provided as shown in FIG. 8. Each of the first wing W11, the second wing W13, the third wing W31, and the fourth wing W33 may include a material with a small thermal expansion coefficient. As an example, each of the first wing W11, the second wing W13, the third wing W31, and the fourth wing W33 may include Invar, but are not limited thereto or thereby. In an embodiment, each of the first wing W11, the second wing W13, the third wing W31, and the fourth wing W33 may have a thickness from about 10 μm to about 30 μm. The mask M may be used to form a pattern on the substrate in the deposition process. The mask M may be disposed between the first wing W11, the second wing W13, the third wing W31, and the fourth wing W33. The mask M may have a thin film shape. Accordingly, the mask M may be sagged downward or deformed due to gravity.

Figure 10:
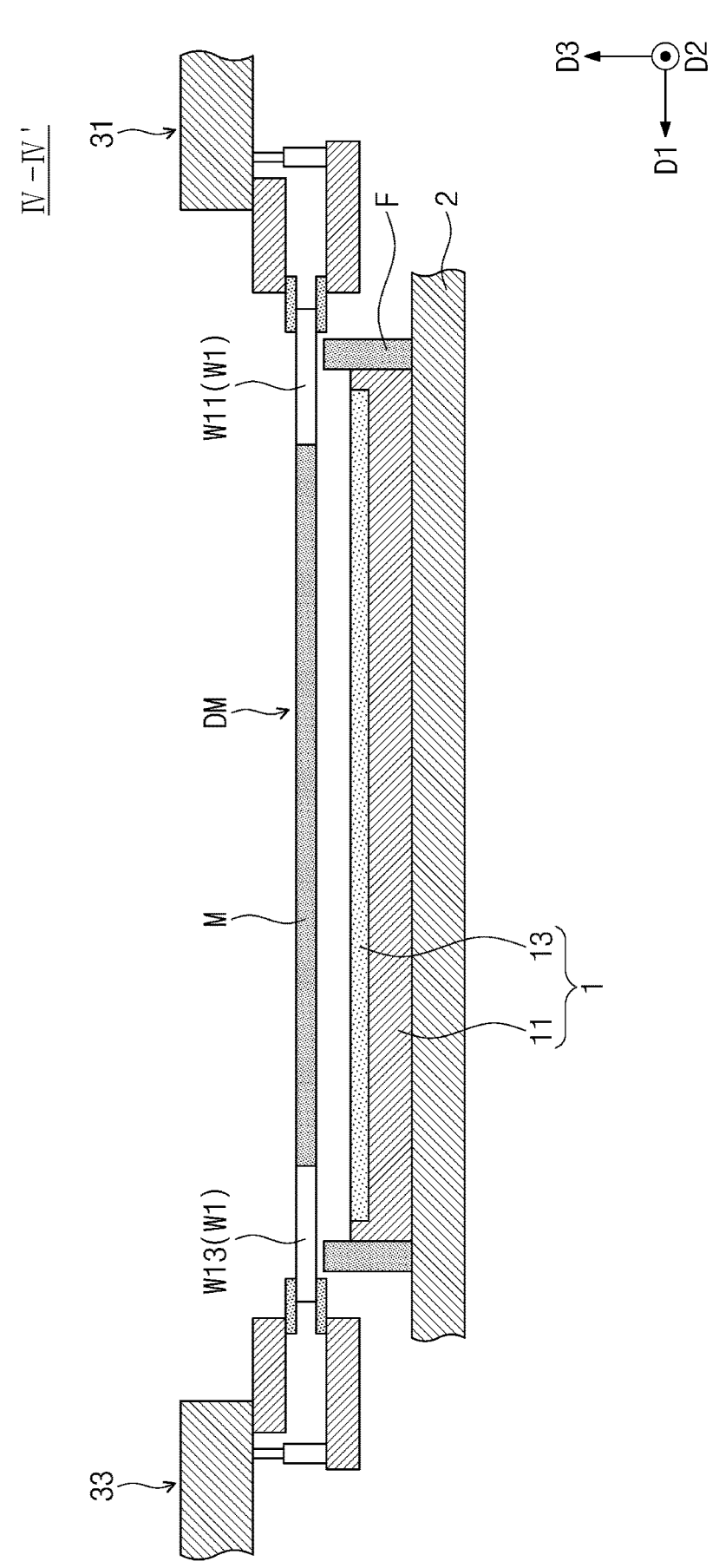

Referring to FIGS. 4 and 10, the tensioning of the process mask in the first direction by the clamping unit (S41) may include allowing the first clamp 31 to lift up the first wing W11 and allowing the second clamp 33 to lift up the second wing W13. In this case, the process mask DM may be spaced apart upward from the upper surface of each of the frame F and the fixing stick FS by a distance (e.g., a predetermined distance). The first clamp 31 may apply a force in the direction opposite to the first direction D1 while lifting the first wing W11. The second clamp 33 may apply a force in the first direction D1 while lifting the second wing W13. Accordingly, the process mask DM may be tensioned in the first direction D1. That is, a force may be applied to the process mask DM such that the process mask DM may be pulled tight in the first direction D1. Accordingly, the mask M may be prevented or substantially prevented from sagging downward. As shown in FIG. 9, the process mask DM may have a length longer in the first direction D1 than that in the second direction D2. Accordingly, a strong force may be required to tension the process mask DM in the first direction D1. In a case in which the process mask DM is tensioned in the first direction D1 using the clamping unit 3, the strong force may be applied. Therefore, when the clamping unit 3 is used to tension the process mask DM in the first direction D1, the mask M may be easily prevented or substantially prevented from sagging downward.

Figure 11:
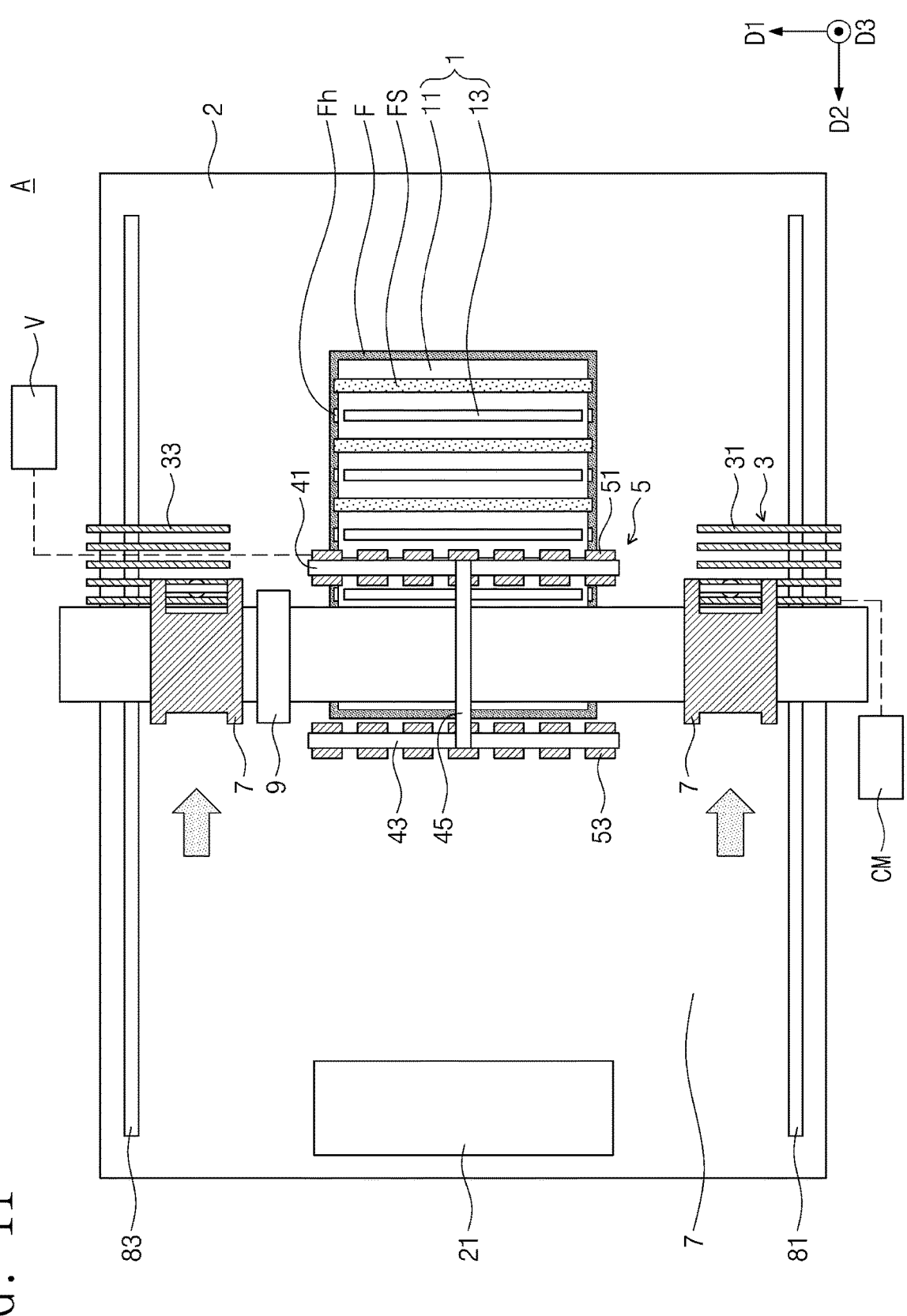

Referring to FIGS. 4 and 11, the tensioning of the process mask in the second direction using the chucking unit (S42) may include moving the gantry 6 and allowing the chucking unit 5 to adsorb the process mask DM.

Figure 12:
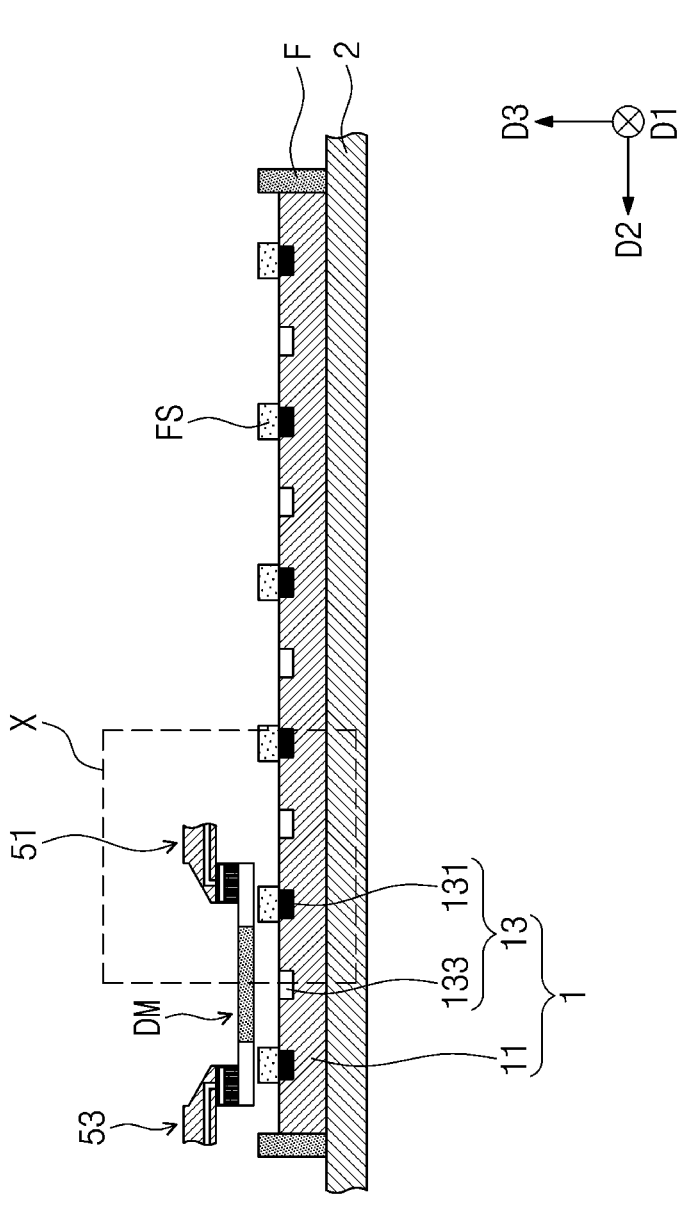
Figure 13:
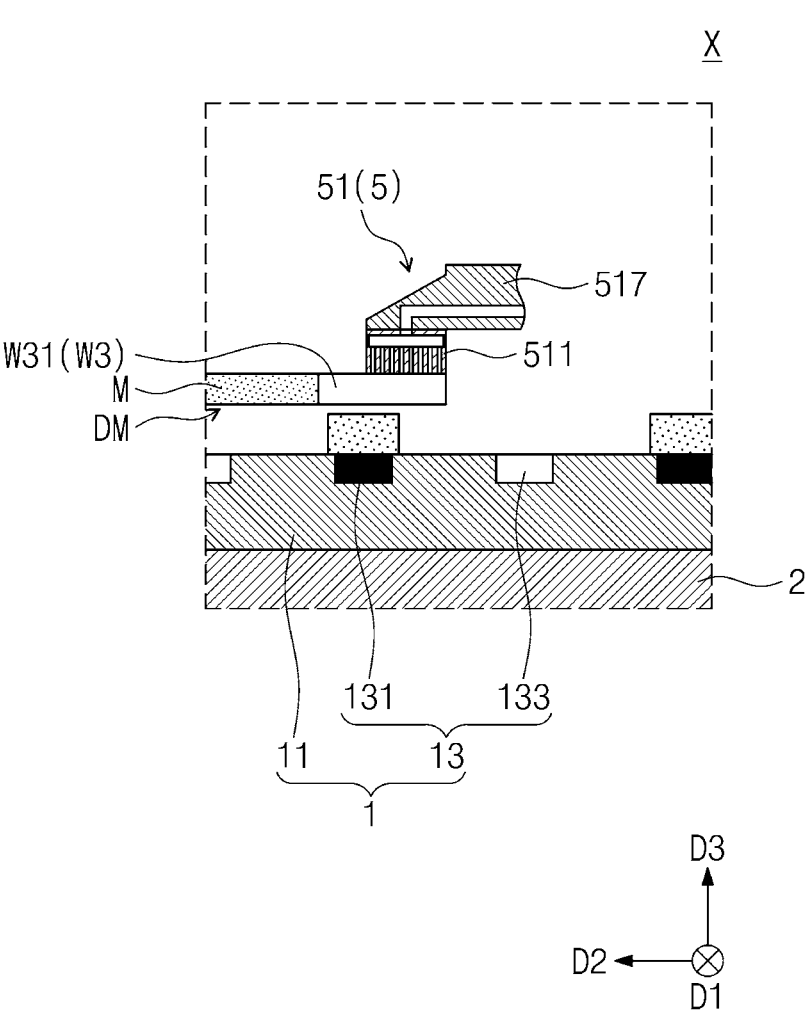

Referring to FIGS. 12 and 13, the first chuck 51 may adsorb the third wing W31. In further detail, a portion of an upper surface of the third wing W31 may be in contact with a lower surface of the adsorption body 511 due to the vacuum pressure provided by the vacuum pump V (refer to FIG. 11). In an embodiment, since the adsorption hole 513*h* (refer to FIG. 2) is provided in plural, the third wing W31 may be evenly adsorbed to the lower surface of the adsorption body 511. In this case, the process mask DM may be spaced apart upward from the upper surface of each of the frame F and the fixing stick FS by a distance (e.g., a predetermined distance). The first chuck 51 may apply the force to the direction opposite to the second direction D2 while picking up the third wing W31.

Referring to FIG. 12 again, the second chuck 53 may adsorb the fourth wing W33 (refer to FIG. 8). The second chuck 53 may apply a force to the second direction D2 while picking up the fourth wing W33. Accordingly, the process mask DM may be tensioned in the second direction D2. That is, the force may be applied to the process mask DM such that the process mask DM may be pulled tight in the second direction D2. Accordingly, the mask M may be prevented or substantially prevented from sagging downward. As shown in FIG. 9, a length in the second direction D2 of the process mask DM may be relatively short. In an embodiment, the plural process masks DM may be arranged in one frame F along the second direction D2. Therefore, a portion of the process mask DM may be disposed in the frame F with respect to the second direction D2. In further detail, the third wing W31 and the fourth wing W33 may be disposed in the frame F. Thus, it is difficult to use the clamping unit 3 to pick up the third wing W31 and the fourth wing W33 and to tension the process mask DM in the second direction D2. As an example, the clamp may be stuck by the frame F and, as a result, the clamp may not approach the third wing W31 and the fourth wing W33. Accordingly, the process mask DM may be tensioned in the second direction D2 by using the chucking unit 5.

The position of the process mask DM may be aligned while the process mask DM is pulled tight in four directions by the first clamp 31, the second clamp 33, the first chuck 51, and the second chuck 53. In this case, the measuring unit 9 (refer to FIG. 11) may identify the alignment of the process mask DM and may provide feedback of the identified alignment.

Figure 14:
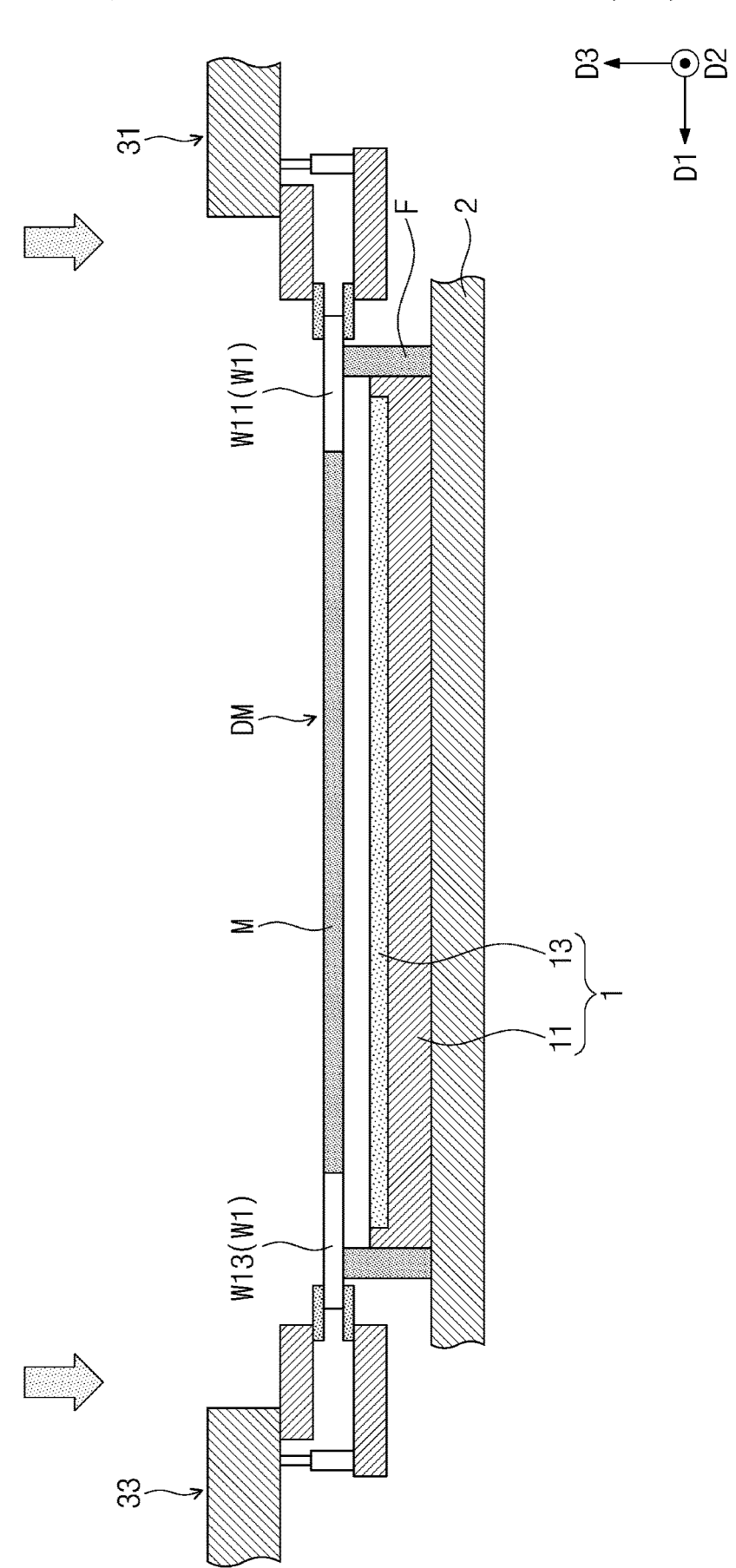
Figure 15:
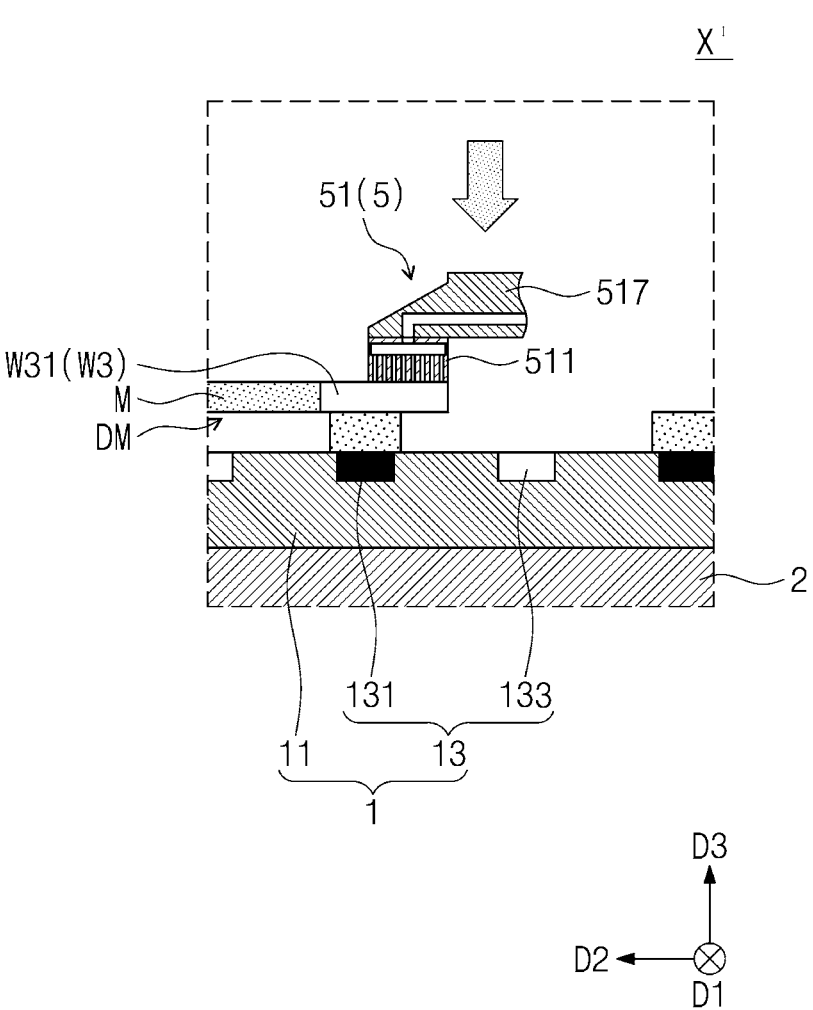

Referring to FIGS. 14 and 15, when the process mask DM is aligned in a correct place, the first clamp 31, the second clamp 33, the first chuck 51, and the second chuck 53 may descend. Accordingly, the process mask DM may be in contact with the upper surface of each of the frame F and the fixing stick FS.

Figure 16:
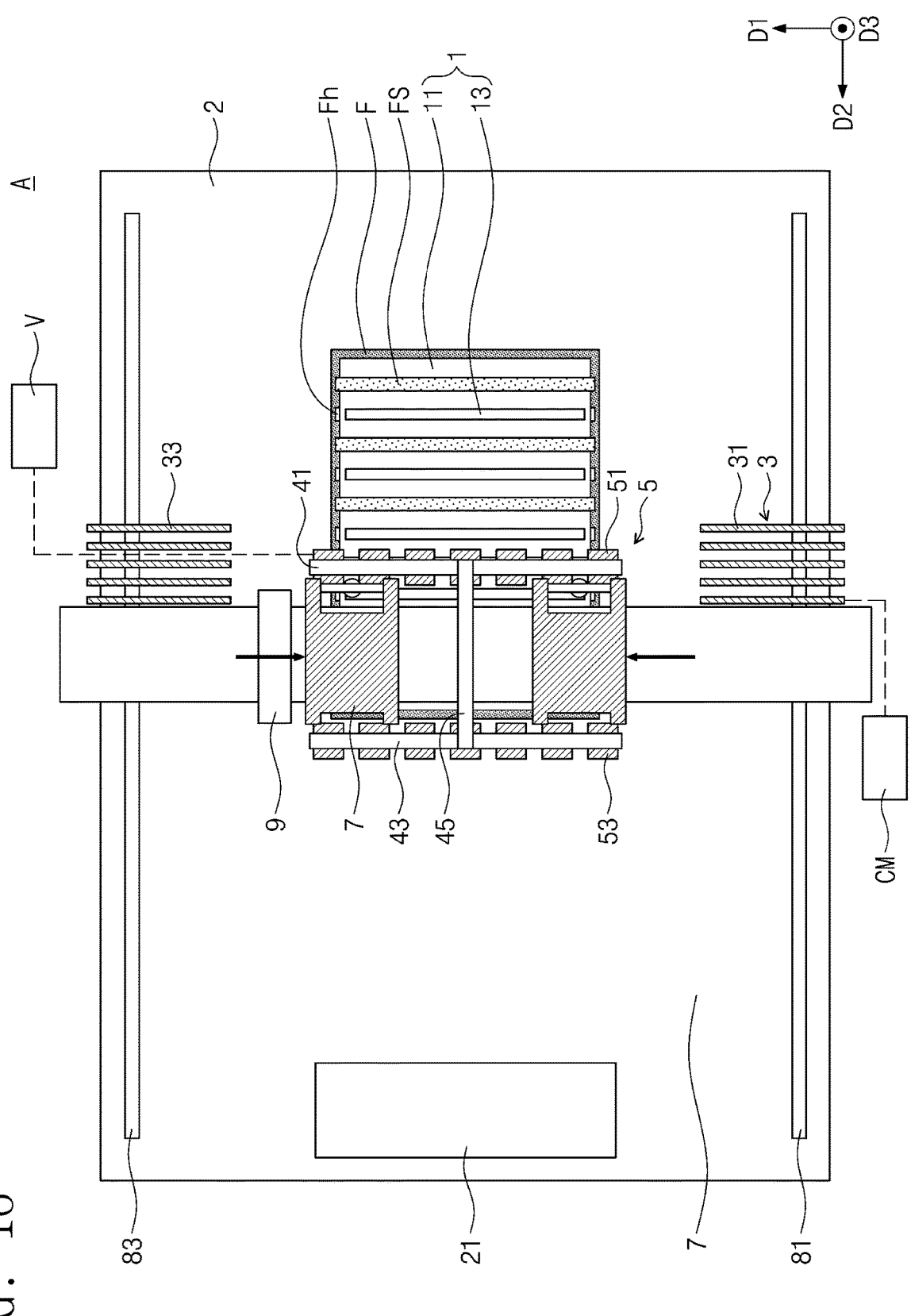

Referring to FIGS. 4 and 16, the welding of the process mask (S5) may include moving the laser unit 7 onto the first wing W11 to the fourth wing W33.

Figure 17:
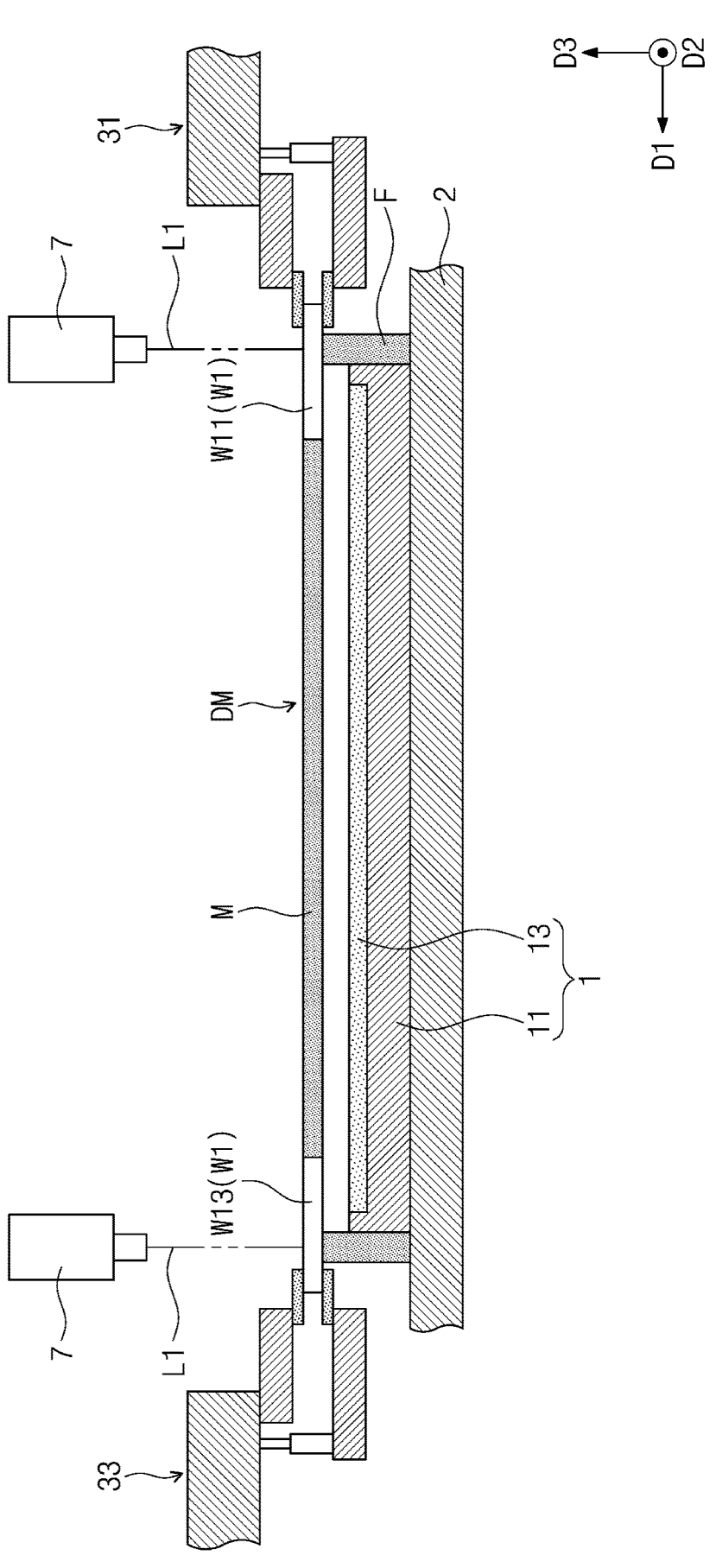

Referring to FIG. 17, the welding laser unit of the laser unit 7 may weld the first wing W11 and the second wing W13. In further detail, the welding laser unit may irradiate a welding laser beam L1 to a portion of the first wing W11, which is not inserted into the first clamp 31 and disposed on the frame F. Accordingly, the first wing W11 may be welded onto and fixed to the frame F. In addition, the welding laser unit may irradiate the welding laser beam L1 to a portion of the second wing 13, which is not inserted into the second clamp 33 and disposed on the frame F. Accordingly, the second wing W13 may be welded to and fixed to the frame F.

Figure 18:
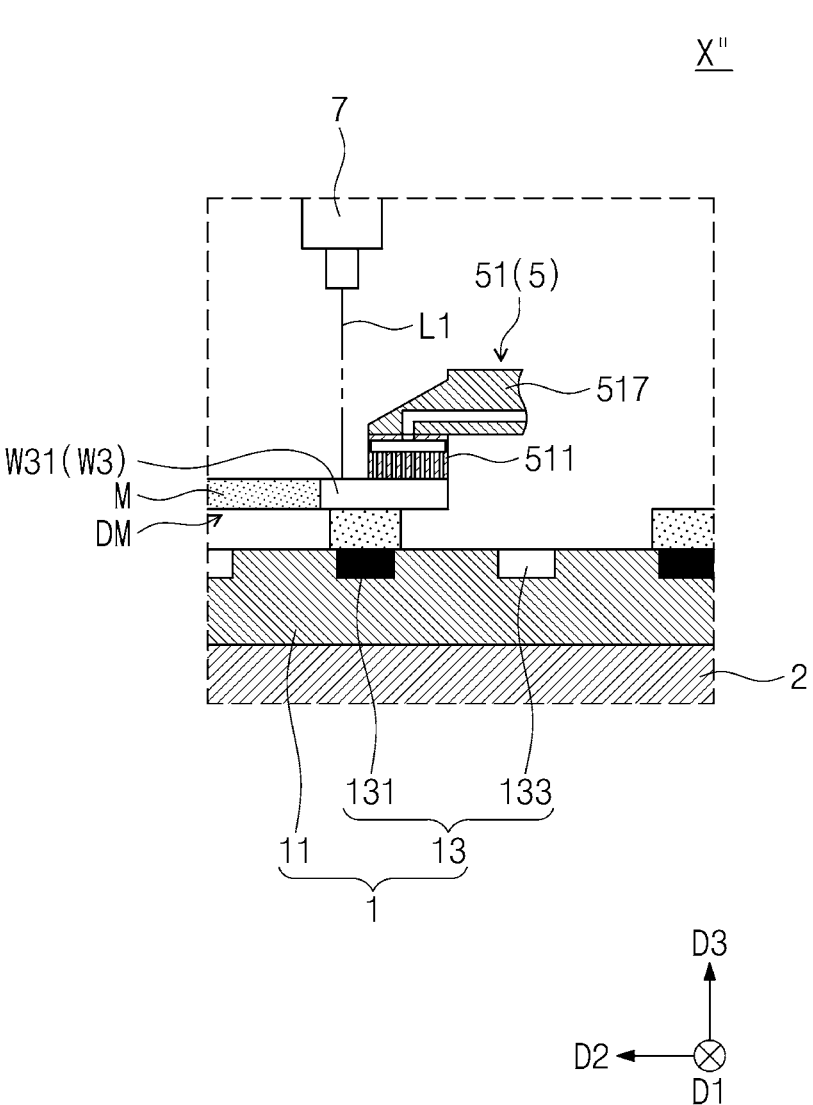

Referring to FIG. 18, the welding laser unit of the laser unit 7 may weld the third wing W31 and the fourth wing W33. In further detail, the welding laser unit may irradiate the welding laser beam L1 to a portion of the third wing W31, which is not adsorbed to the first chuck 51 and disposed on the fixing stick FS. Accordingly, the third wing W31 may be welded to and fixed to the fixing stick FS. In addition, although not shown in figures, the welding laser unit may irradiate the welding laser beam L1 to a portion of the fourth wing W33, which is not adsorbed to the second chuck 53 and disposed on the fixing stick FS. Accordingly, the fourth wing W33 may be welded to and fixed to the fixing stick FS.

The process mask DM may be fixed to and coupled with the frame F and the fixing stick FS due to the welding process by the welding laser unit.

Figure 19:
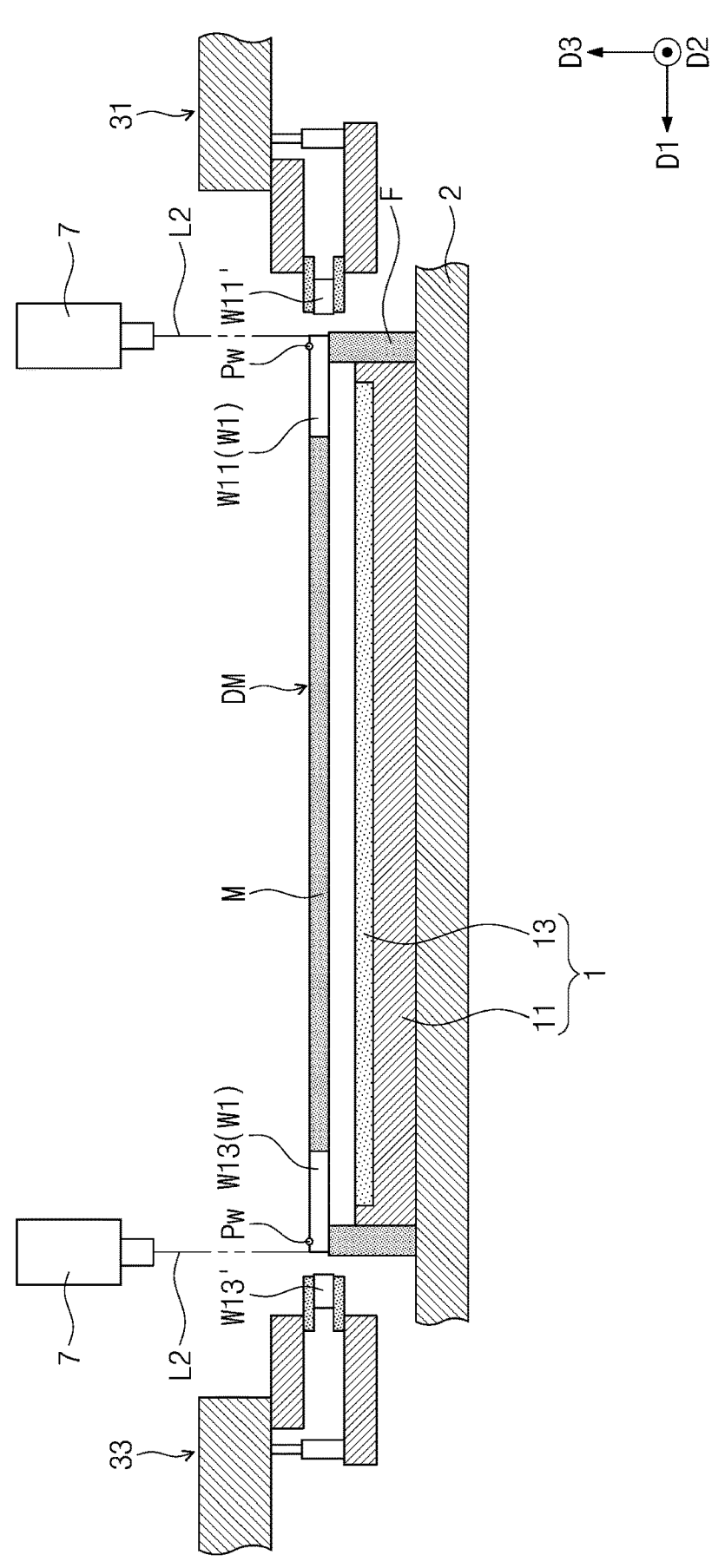

Referring to FIGS. 4 and 19, the cutting of the portion of the process mask (S6) may include cutting the first wing W11 and the second wing W13 by the cutting laser unit of the laser unit 7. In further detail, the cutting laser unit may apply a cutting laser beam L2 to a portion of the first wing W11, which is disposed outside a welding point Pw. Accordingly, a portion W11' of the first wing W11 may be cut and separated from the first wing W11. The portion of the first wing W11, which is protruded outward from the frame F, may be removed. In addition, the cutting laser unit may apply the cutting laser beam L2 to a portion of the second wing W13, which is disposed outside a welding point Pw. Therefore, a portion W13' of the second wing W13 may be cut and separated from the second wing W13. In further detail, the portion of the second wing W13, which is protruded outward from the frame F, may be removed.

Figure 20:
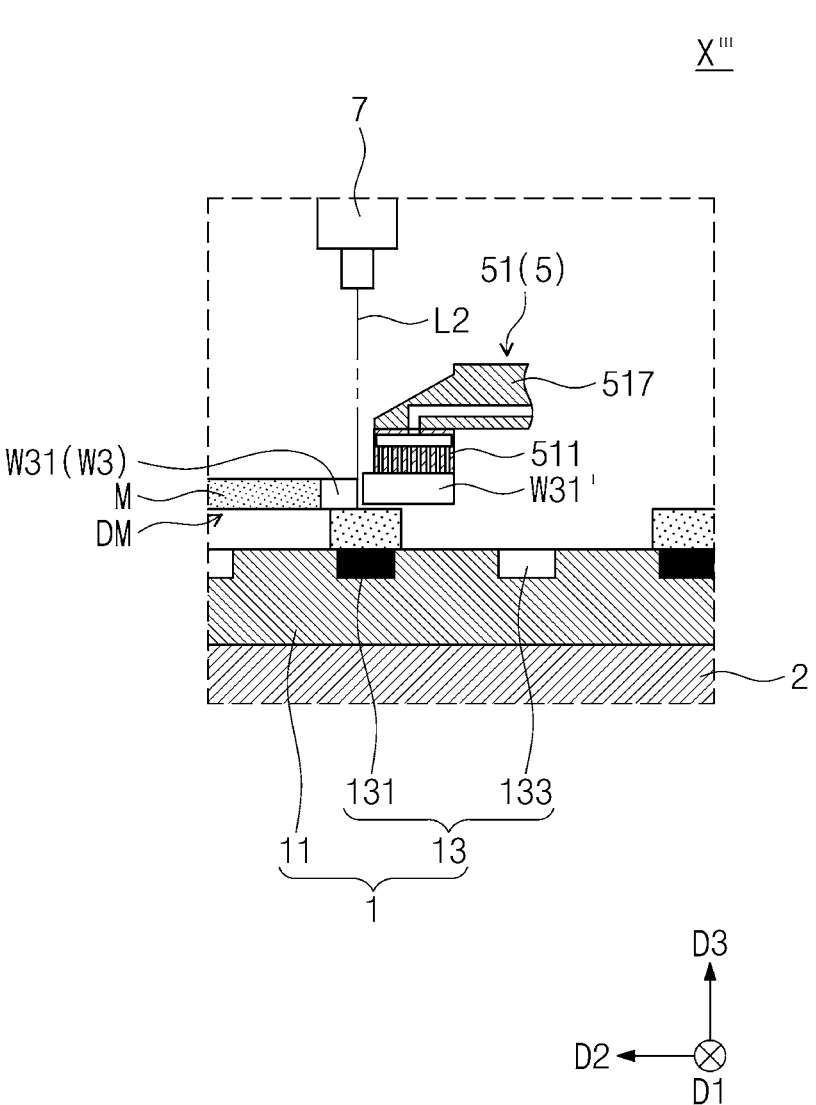

Referring to FIG. 20, the manufacturing method may include cutting the third wing W31 and the fourth wing W33 using the cutting laser unit of the laser unit 7. In further detail, the cutting laser unit may irradiate the cutting laser beam L2 to a portion of the third wing W31, which is disposed outside a welding point. Accordingly, a portion W31' of the third wing W31 may be cut and separated from the third wing W31. The portion of the third wing W31, which is protruded outward from the fixing stick FS, may be removed. In addition, although not shown in figures, the cutting laser unit may irradiate the cutting laser beam L2 to a portion of the fourth wing W33, which is disposed outside a welding point. Accordingly, the portion of the fourth wing W33 may be cut and separated from the fourth wing W33.

In further detail, the portion of the fourth wing W33, which is protruded outward from the fixing stick FS, may be removed.

Figure 21:
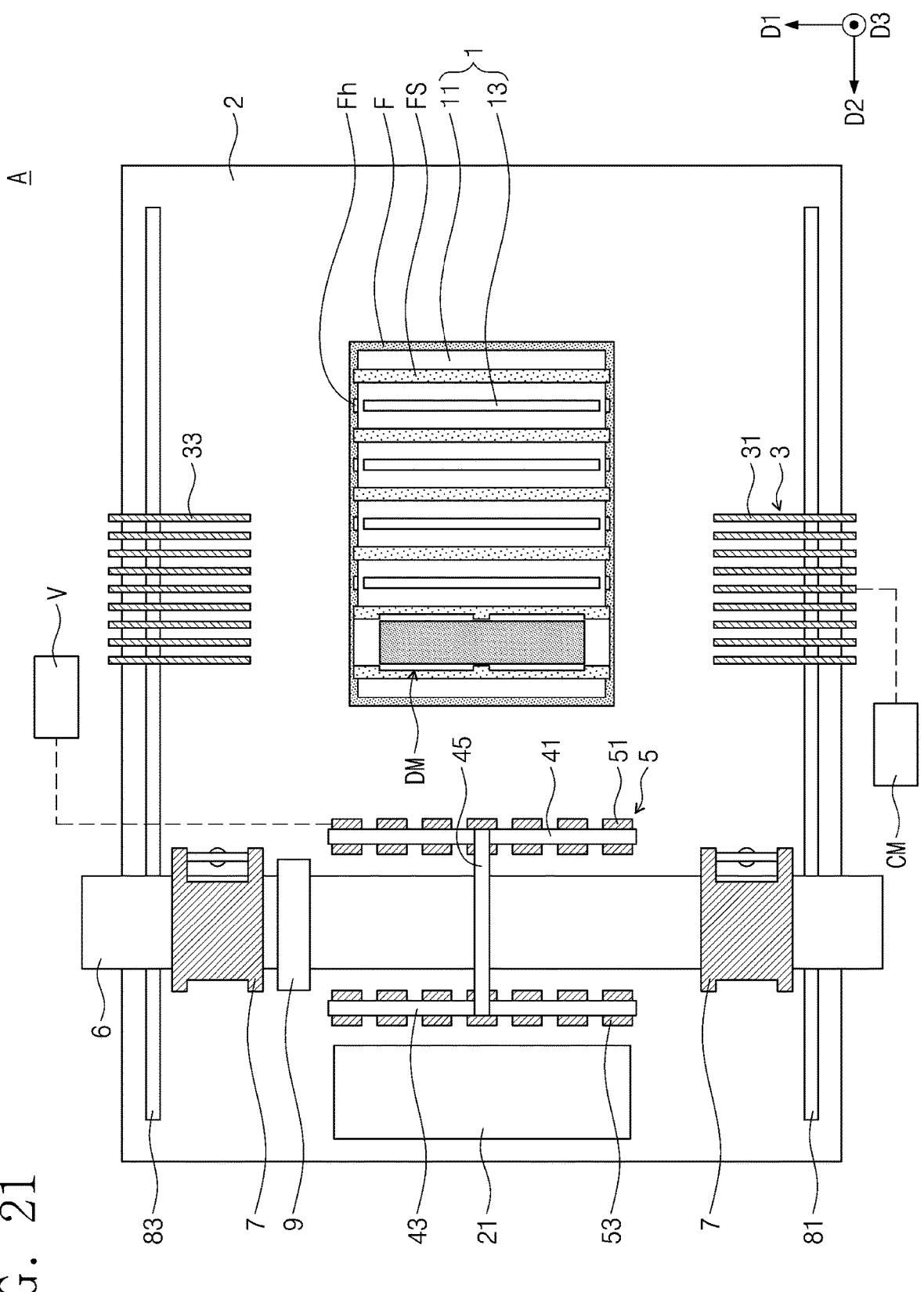

Referring to FIG. 21, the process mask DM may be fixed to the frame F and the fixing stick FS. In this case, since the fixing stick FS is fixed by the fixing unit 13, the position and the shape of the fixing stick FS may be prevented or substantially prevented from being changed even though a force is applied in the second direction D2 by a restoring force of the process mask DM welded to the fixing stick FS while being tensioned.

Figure 22:
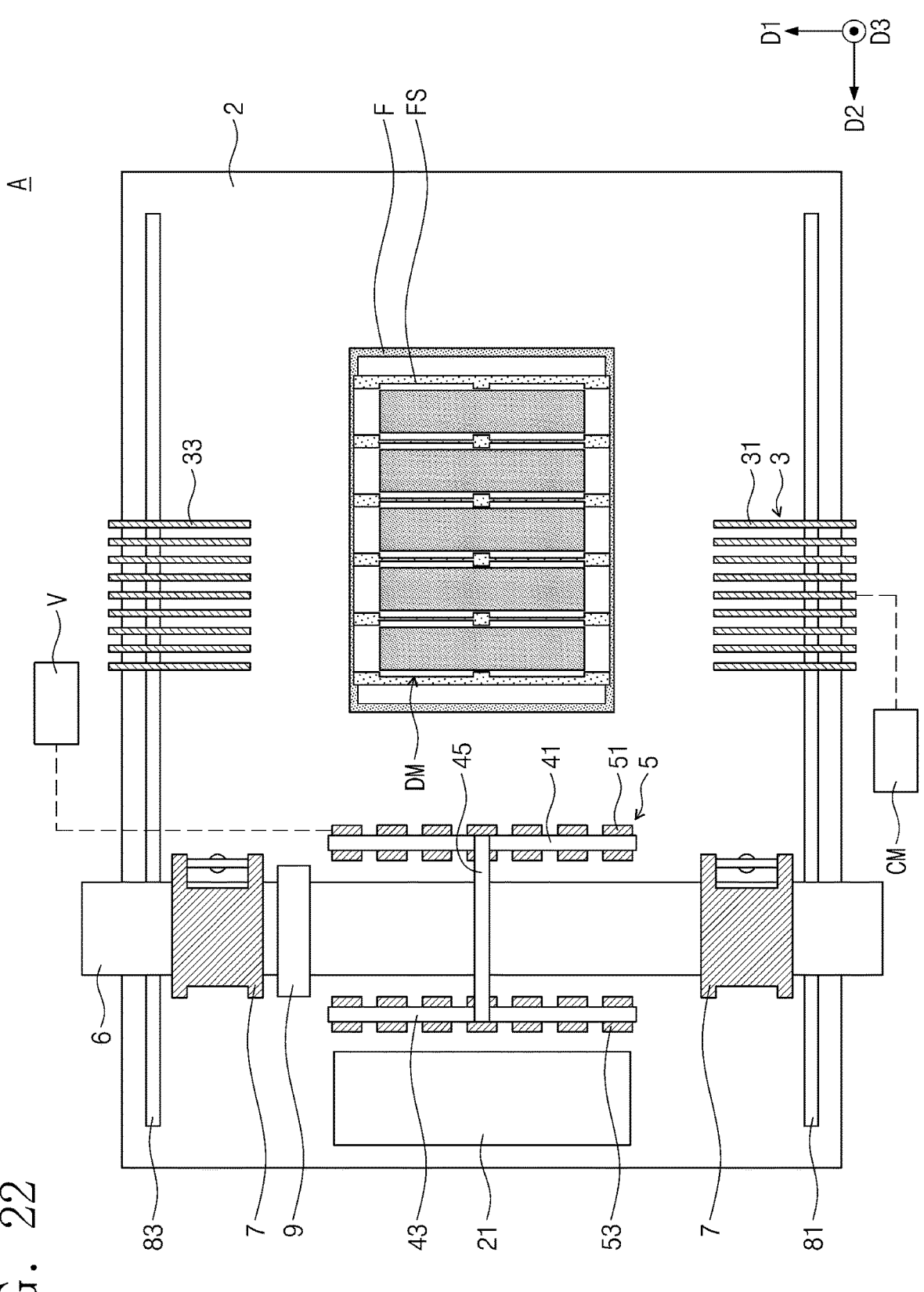

Referring to FIG. 22, the processes shown in FIGS. 9 to 21 are repeated, and, thus, the process masks DM may be fixed to and coupled with the frame F.

Figure 23:
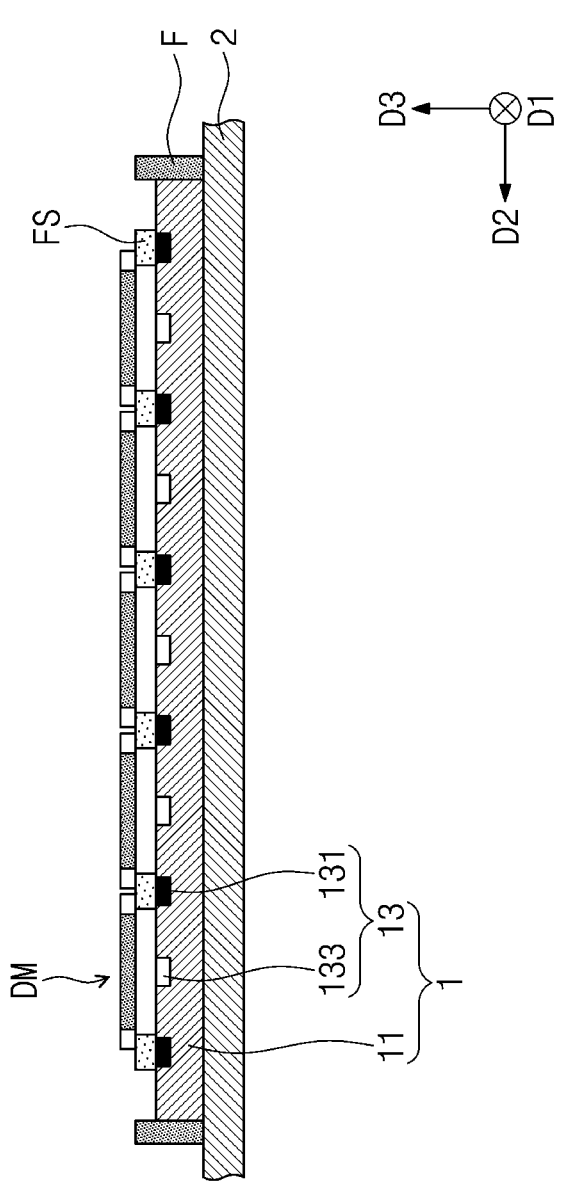

Referring to FIGS. 4 and 23, the releasing of the fixing of the fixing stick (S7) may include releasing the fixing stick FS after the process masks DM are coupled with the frame F. Since the tensioned process masks DM apply forces in opposite directions to return to their original state and the forces are offset from each other, the position and/or the shape of the fixing stick FS may not be changed even though the fixing of the fixing stick FS is released.

Figure 24:
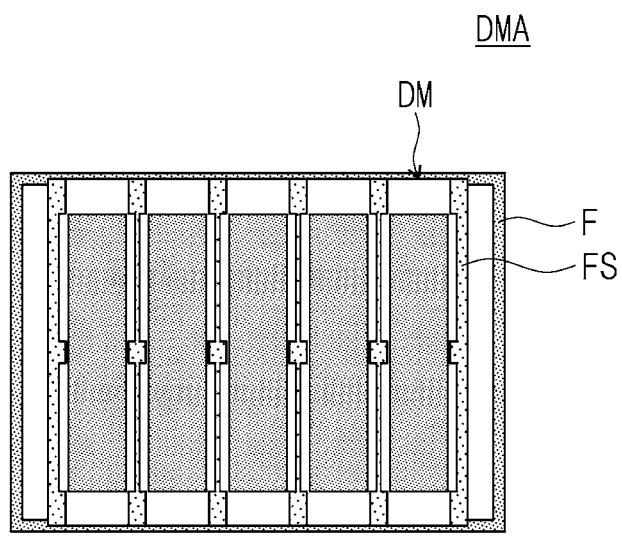
FIG. 24 is a plan view showing a display processing mask according to an embodiment of the present disclosure.

FIG. 24 is a plan view showing the display processing mask DMA.

Referring to FIG. 24, a plurality of process masks DM may be fixed to and coupled with the frame F. The deposition process may be performed on a display substrate using the completed display processing mask DMA.

According to the display processing mask manufacturing apparatus and the display processing mask manufacturing method, since one side of the process mask is tensioned by the clamp, a great force may be applied to the one side of the process mask. In addition, since the other side of the process mask is tensioned by a vacuum chuck, the wing of the portion of the process mask disposed in the frame may also be smoothly adsorbed and tensioned. Accordingly, the process mask may be tensioned in four directions.

According to the display processing mask manufacturing apparatus and the display processing mask manufacturing method, the process mask may be fixed to and coupled with the frame while being tensioned in four directions. Accordingly, the mask may be prevented or substantially prevented from sagging downward, and the display processing mask with high quality may be manufactured. In addition, since the alignment of the process mask may be controlled while being tensioned in four directions, an accuracy in alignment of the process mask may be improved. Thus, a yield may be improved. Further, since the process mask is tensioned in four directions, a large-sized process mask may be manufactured without shrinkage, deformation, or sagging.

According to the display processing mask manufacturing apparatus and the display processing mask manufacturing method, since the fixing stick is fixed by the fixing unit, the position and the shape of the fixing stick may be prevented or substantially prevented from being changed due to the restoring force of the process mask during the manufacturing process. Accordingly, the display processing mask with high accuracy may be manufactured.

According to the display processing mask manufacturing apparatus and the display processing mask manufacturing method, since the chuck may be provided with the plural adsorption holes, the chuck may uniformly adsorb the wing of the process mask, and the accuracy in the deposition process may be improved.

Figure 25:
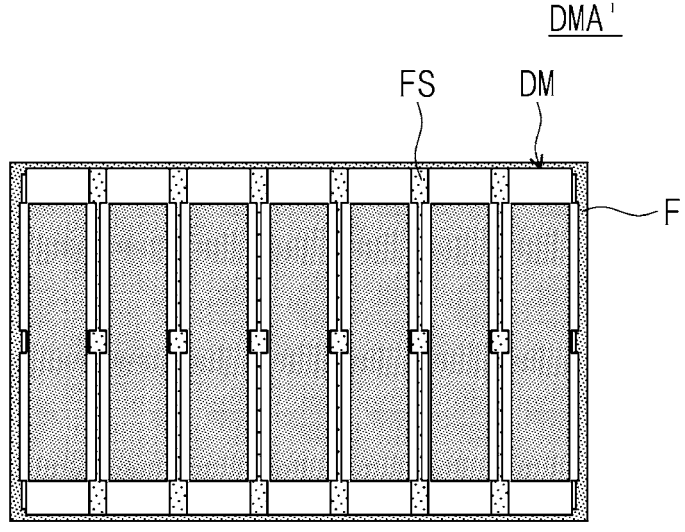
FIG. 25 is a plan view showing a display processing mask according to an embodiment of the present disclosure.

FIG. 25 is a plan view showing a display processing mask DMA'.

In FIG. 25, details that are the same as or similar to those described with reference to FIGS. 1 to 24 may be omitted for the convenience of explanation.

Referring to FIG. 25, the display processing mask DMA' may be provided. The display processing mask DMA' may be manufactured by the display processing mask manufacturing apparatus A (refer to FIG. 1) described with reference to FIG. 1. However, different from the descriptions with reference to FIG. 24, a portion of a process mask DM may be coupled with a frame F. In further detail, among a plurality of process masks DM arranged in one direction, a third wing and/or a fourth wing of a process mask DM disposed at an outermost position may be welded onto the frame F. As a side surface of a portion of the process mask DM may be directly welded to the frame F, a durability of the display processing mask DMA' may be improved.

Figure 26:
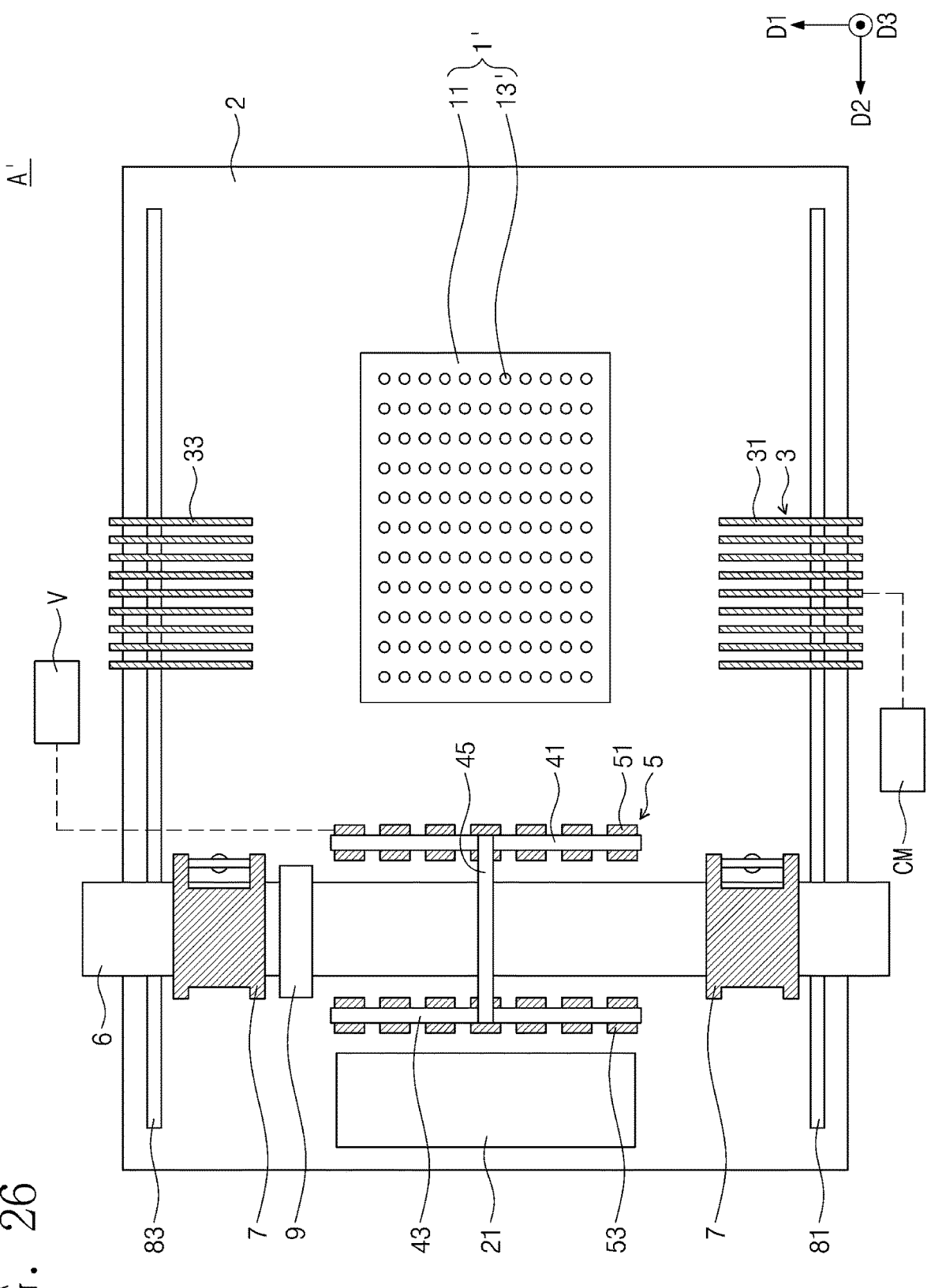
FIG. 26 is a plan view showing an apparatus for manufacturing a display processing mask according to an embodiment of the present disclosure.

FIG. 26 is a plan view showing an apparatus of manufacturing a display processing mask according to an embodiment of the present disclosure.

In FIG. 26, details that are the same as or similar to those described with reference to FIGS. 1 to 25 may be omitted for the convenience of explanation.

Referring to FIG. 26, a display processing mask manufacturing apparatus A' may be provided. However, different from the descriptions with reference to FIG. 1, a fixing unit 13' of a stage 1' of the display processing mask manufacturing apparatus A' may be provided in plural, and the fixing units 13' may be spaced apart from each other in the first direction D1. In an embodiment, each of the fixing units 13' may have a circular shape rather than a shape extending long in the first direction D1 as shown in FIG. 1. The fixing units 13' each having the circular shape may be arranged spaced apart from each other in the first direction D1 and the second direction D2.

Figure 27:
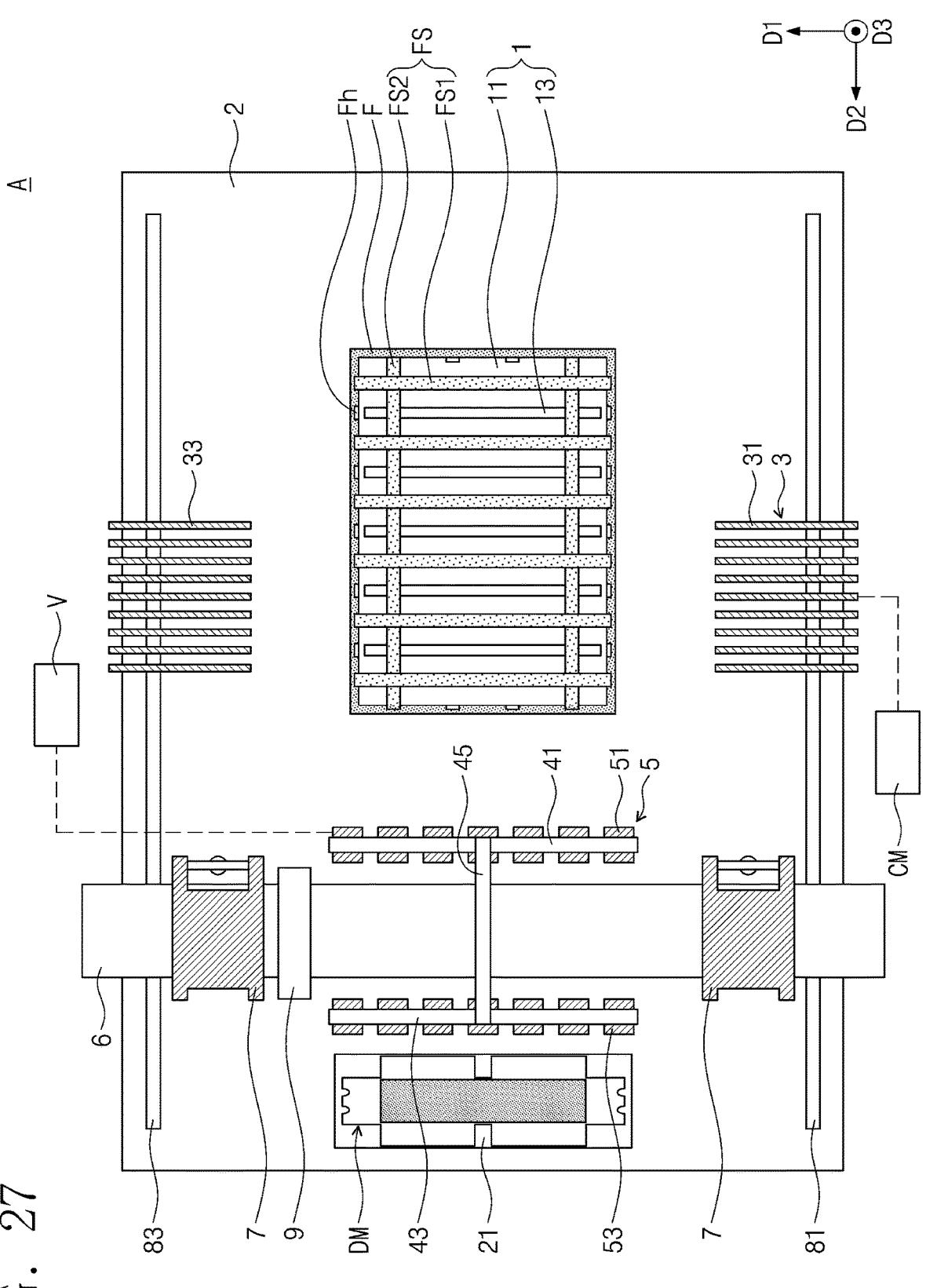
FIG. 27 is a plan view showing an apparatus for manufacturing a display processing mask according to an embodiment of the present disclosure.

FIG. 27 is a plan view showing an apparatus of manufacturing a display processing mask according to an embodiment of the present disclosure.

In FIG. 27, details that are the same as or similar to those described with reference to FIGS. 1 to 26 may be omitted for the convenience of explanation.

Referring to FIG. 27, a fixing stick FS may be disposed on a frame F. However, different from the structure shown in FIG. 6, the fixing stick FS may include a first fixing stick FS1 and a second fixing stick FS2. The first fixing stick FS1 may extend in the first direction D1. That is, the first fixing stick FS1 may be disposed substantially the same as or similar to the fixing stick described with reference to FIG. 6. The first fixing stick FS1 may be provided in plural. The second fixing stick FS2 may extend in the second direction D2. The second fixing stick FS2 may be disposed to cross the first fixing sticks FS1. The second fixing stick FS2 may be provided in plural. The second fixing sticks FS2 may be spaced apart from each other in the first direction D1. Since the first and second fixing sticks FS1 and FS2 are arranged to cross each other, the process mask DM disposed on the first and second fixing sticks FS1 and FS2 may be firmly supported.

Although some embodiments of the present disclosure have been described, it is to be understood that the present disclosure is not limited to these embodiments, but various changes and modifications can be made by one of ordinary skill in the art within the spirit and scope of the present disclosure as herein claimed. Therefore, the disclosed subject matter should not be limited to any single embodiment described herein, and the scope of the present inventive concept shall be determined according to the claims.

What is claimed is:

1. An apparatus for manufacturing a display processing mask, the apparatus comprising:
   a stage;
   a clamp arranged outside the stage; and
   a chuck configured to move in a direction and arranged above the stage,
   wherein the clamp comprises:
   a first clamp pulling a first wing of the display processing mask; and
   a second clamp spaced apart from the first clamp in a first direction and arranged at a position opposite to a position of the first clamp with respect to the stage and pulling a second wing of the display processing mask, the second wing being spaced apart from the first wing in the first direction, and
   wherein the chuck comprises:
   a first chuck adsorbing a third wing of the display processing mask using a vacuum pressure to pull the third wing; and
   a second chuck spaced apart from the first chuck in a second direction crossing the first direction and adsorbing a fourth wing of the display processing mask using a vacuum pressure to pull the fourth wing in the second direction, the fourth wing being spaced apart from the third wing in the second direction, at least one of the first chuck or the second chuck being movable in the second direction or a direction opposite to the second direction so as to pull and tension the display processing mask while at least one of the first clamp or the second clamp pulls the display processing mask in the first direction.

2. The apparatus of claim 1, wherein the stage comprises a fixing unit to selectively fix a fixing stick on the stage.

3. The apparatus of claim 2, wherein the fixing unit comprises at least one of a magnet to magnetically couple the fixing stick on the stage, a vacuum hole to vacuum adsorb the fixing stick on the stage, and an electrostatic chuck to fix the fixing stick on the stage using an electrostatic force.

4. The apparatus of claim 2, wherein the fixing unit is provided in plural, each of the fixing units extends in the first direction, and the fixing units are spaced apart from each other in the second direction.

5. The apparatus of claim 1, wherein the chuck further comprises a vacuum pump, the first chuck comprises an adsorption body, and the adsorption body comprises:
   a vacuum pressure distribution space defined in the adsorption body and connected to the vacuum pump; and
   an adsorption hole extending downward from the vacuum pressure distribution space and connected to a lower surface of the adsorption body, wherein the adsorption hole is provided in plural, and the adsorption holes are spaced apart from each other in a horizontal direction.

6. The apparatus of claim 1, further comprising:
   a welding laser unit to weld the fixing stick on the stage to a process mask arranged on the fixing stick; and
   a cutting laser unit to cut a portion of the process mask.

7. The apparatus of claim 1, further comprising a gantry, wherein each of the first chuck and the second chuck is provided in plural, the first chucks are spaced apart from each other in the first direction, the second chucks are spaced apart from each other in the first direction, and the gantry moves the first chucks and the second chucks.

8. The apparatus of claim 1, further comprising a clamp driver, wherein each of the first clamp and the second clamp is provided in plural, the first clamps are spaced apart from each other in the second direction, the second clamps are spaced apart from each other in the second direction, and the clamp driver moves the first clamps and the second clamps.

9. An apparatus for manufacturing a display processing mask, the apparatus comprising:

a support body;

a pair of clamps arranged above the support body; and a pair of chucks arranged above the support body, wherein the clamps are spaced apart from each other in a horizontal direction and pulling each of wings of the display processing mask, and the chucks are spaced apart from each other in a horizontal direction perpendicular to the horizontal direction in which the clamps are spaced apart from each other and pulling each of wings of the display processing mask, at least one of the pair of chucks being movable in the horizontal direction in which the chucks are spaced apart from each other or a direction opposite to the horizontal direction in which the chucks are spaced apart from each other so as to pull and tension the display processing mask while the pair of clamps pulls the display processing mask in the horizontal direction in which the clamps are spaced apart from each other.

10. The apparatus of claim 9, further comprising a fixing unit to selectively fix a fixing stick on the support body, and the fixing unit comprises at least one of a magnet, a vacuum hole, and an electrostatic chuck.

11. The apparatus of claim 10, wherein the fixing unit is provided in plural, and the fixing units are spaced apart from each other in the horizontal direction in which the chucks are spaced apart from each other.

12. The apparatus of claim 10, further comprising:

a stage arranged on the support body; and a mask loader arranged on the support body, wherein the fixing unit is provided in the stage.

13. The apparatus of claim 9, further comprising a vacuum pump, wherein each of the chucks comprises an adsorption body, the adsorption body comprising:

a vacuum pressure distribution space connected to the vacuum pump; and an adsorption hole extending up and down to expose the vacuum pressure distribution space to a lower space of the adsorption body, wherein the adsorption hole is provided in plural, and the adsorption holes are spaced apart from each other in the horizontal direction in which the chucks are spaced apart from each other.

14. A method of manufacturing a display processing mask, the method comprising:

arranging a frame on a support body;

arranging a fixing stick on the frame;

arranging a process mask on the fixing stick;

tensioning the process mask; and welding the tensioned process mask to the frame, wherein the tensioning the process mask comprises:

tensioning the process mask in a first direction using a clamp; and tensioning the process mask in a second direction crossing the first direction using a chuck.

15. The method of claim 14, wherein the tensioning of the process mask in the first direction using the clamp comprises:

pulling a first wing of the process mask using a first clamp of the clamp; and pulling a second wing of the process mask using a second clamp of the clamp, the second wing being spaced apart from the first wing in a direction opposite to the first direction, and wherein the tensioning of the process mask in the second direction using the chuck comprises:

adsorbing a third wing of the process mask using a first chuck of the chuck using a vacuum pressure to pull the third wing in the second direction; and adsorbing a fourth wing of the process mask which is spaced apart from the third wing in the second direction using a second chuck of the chuck to pull the fourth wing in a direction opposite to the second direction.

16. The method of claim 15, wherein the welding of the process mask comprises:

welding the first wing and the second wing to the frame; and welding the third wing and the fourth wing to the fixing stick.

17. The method of claim 14, further comprising fixing the fixing stick at a certain position using a fixing unit, wherein the fixing unit fixes the fixing stick to the certain position using at least one of a magnetic coupling, a vacuum adsorption, and an electrostatic force.

18. The method of claim 17, wherein the arranging the frame on the support body comprises arranging the frame to surround a stage arranged on the support body, and the fixing unit is provided in the stage.

19. The method of claim 17, further comprising releasing the fixing of the fixing unit using the fixing unit after the welding of the process mask.

20. The method of claim 14, further comprising cutting a portion of the process mask after the welding of the tensioned process mask.

* * * * *